(12) United States Patent  
Arahira

(10) Patent No.: US 7,873,079 B2  
(45) Date of Patent: Jan. 18, 2011

(54) CARRIER-SUPPRESSED OPTICAL PULSE TRAIN GENERATION METHOD AND MODE-LOCKED SEMICONDUCTOR LASER DIODE FOR REALIZING THIS METHOD

(75) Inventor: Shin Arahira, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 535 days.

(21) Appl. No.: 11/790,386

(22) Filed: Apr. 25, 2007

(65) Prior Publication Data

US 2008/0025358 A1 Jan. 31, 2008

(30) Foreign Application Priority Data

Jul. 28, 2006 (JP) ............................. 2006-207064

(51) Int. Cl.
*H01S 3/098* (2006.01)
*H01S 3/10* (2006.01)
*H01S 3/13* (2006.01)
*H01S 3/08* (2006.01)

(52) U.S. Cl. ..................... 372/18; 372/25; 372/29.01; 372/38.02; 372/96; 372/102

(58) Field of Classification Search .................. 372/18, 372/25, 29.01, 96, 102
See application file for complete search history.

(56) References Cited

U.S. PATENT DOCUMENTS

| | | | | |
|---|---|---|---|---|
| 4,726,031 A | * | 2/1988 | Wakao et al. ................. | 372/96 |
| 5,450,428 A | * | 9/1995 | Maeda ......................... | 372/20 |
| 6,031,851 A | * | 2/2000 | Shimizu et al. ............... | 372/18 |
| 6,865,348 B2 | * | 3/2005 | Miyamoto et al. ........... | 398/183 |

(Continued)

OTHER PUBLICATIONS

A. Hirano, et al., "A novel mode-splitting detection scheme in 43-Gb/s CS- and DCS-RZ signal transmission," IEEE J. Lightwave Technology, vol. 20, No. 12, pp. 2029-2034, Dec. 2002, Discussed on pp. 4-6, 60 & 65 of the present application.

(Continued)

*Primary Examiner*—Armando Rodriguez  
*Assistant Examiner*—Phillip Nguyen  
(74) *Attorney, Agent, or Firm*—Rabin & Berdo, P.C.

(57) ABSTRACT

A CS optical pulse train generation method, which is able to change the half width of an optical pulse constituting a CS optical pulse train, and which is compact and has low power consumption. A distributed Bragg reflector semiconductor laser utilized in this method is one which is constituted comprising an optical modulation region, a gain region, a phase control region, and a distributed Bragg reflector region. Current is injected into the gain region by way of a p-side electrode and a n-side common electrode by a constant current source, forming the population inversion required for laser oscillation. Optical modulation required to manifest mode locking is carried out in the optical modulation region. A diffraction grating is formed in the distributed Bragg reflector region. A CS optical pulse train with a repetitive frequency of $f_{rep}$ is generated by adjusting the effective indices of both the phase control region and the distributed Bragg reflector region such that, of the longitudinal modes of the mode-locked semiconductor laser diode, the two longitudinal modes close to the frequency $f_0$, which is the Bragg wavelength of the distributed Bragg reflector region converted to a frequency, become $f_0 + (f_{rep}/2)$ and $f_0 - (f_{rep}/2)$.

11 Claims, 17 Drawing Sheets

U.S. PATENT DOCUMENTS

| | | | | |
|---|---|---|---|---|
| 2002/0048300 | A1* | 4/2002 | Tsukiji et al. | 372/43 |
| 2004/0213317 | A1* | 10/2004 | Hashimoto et al. | 372/102 |
| 2006/0045145 | A1* | 3/2006 | Arahira | 372/18 |
| 2006/0209911 | A1* | 9/2006 | Takabayashi | 372/20 |

OTHER PUBLICATIONS

K. Sato, et al., "Dual mode operation of semiconductor mode-locked lasers for anti-phase pulse generation," Technical Digest of OFC 2000, paper ThW3-1, 2000, Discussed on pp. 8, & 55 of the present application.

H. Murai, et al., "EA modulator-based optical multiplexing/demultiplexing techniques for 160 Gbit/s OTDM signal transmission," IEICE Trans. Electron., vol. E88-C, No. 3, pp. 309-318, Mar. 2005, Discussed on pp. 9-10 of the present application.

S. Arahira and Y. Ogawa, "40 GHz actively mode-locked distributed Bragg reflector laser diode module with an impedance-matching circuit for efficient RF signal injection," Jpn. J. Appl. Phys., vol. 43, No. 4B, pp. 1960-1964, 2004, Discussed on p. 60 of the present application.

"Semiconductor Lasers and Photonic Integrated Circuits" edited by Yasuharu Suematsu, first edition, Ohmsha, Ltd., published Apr. 25, 1984, Discussed on p. 70 of the present application.

* cited by examiner

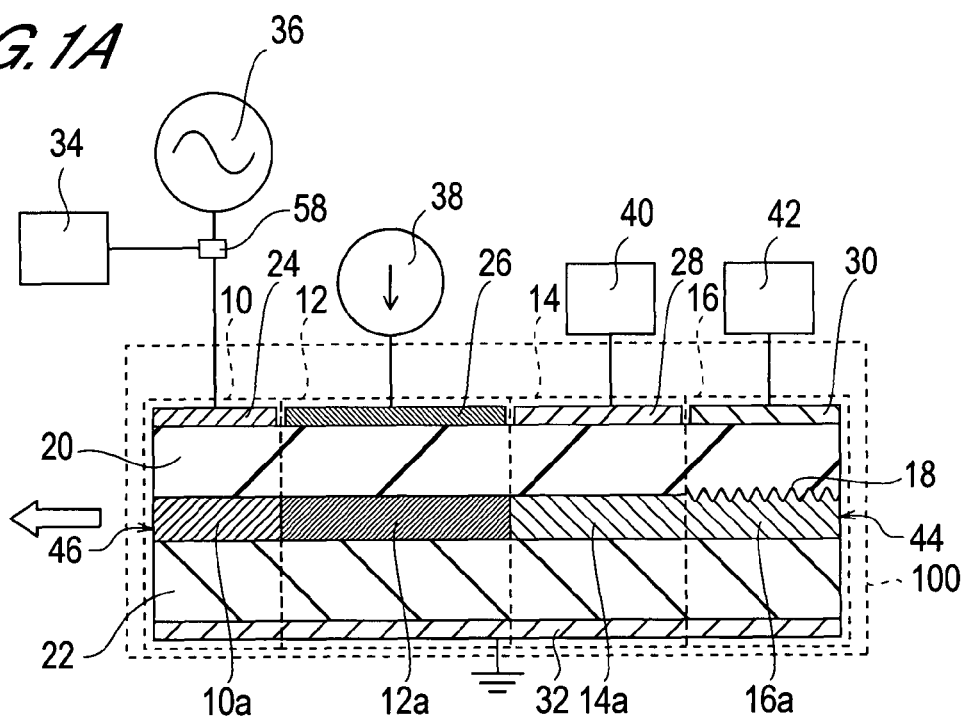
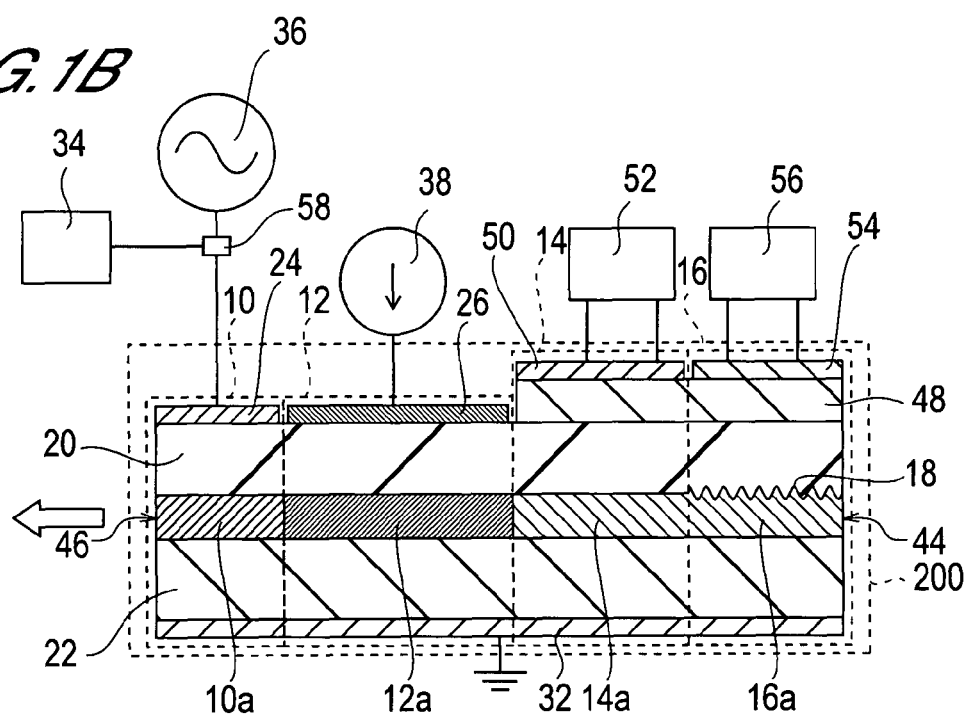

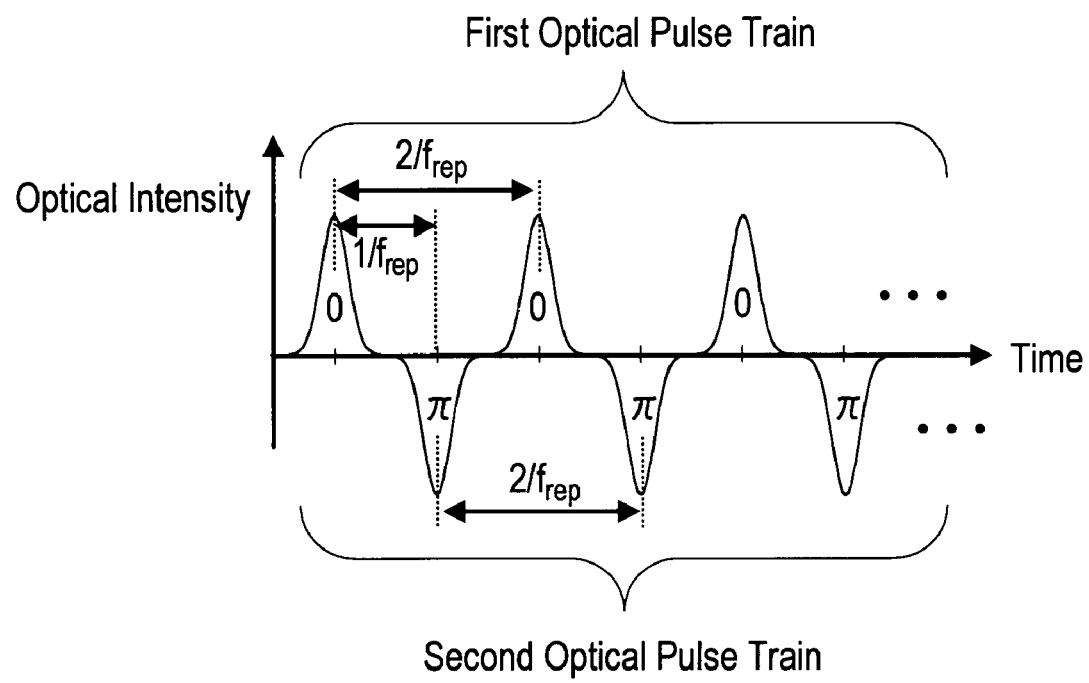

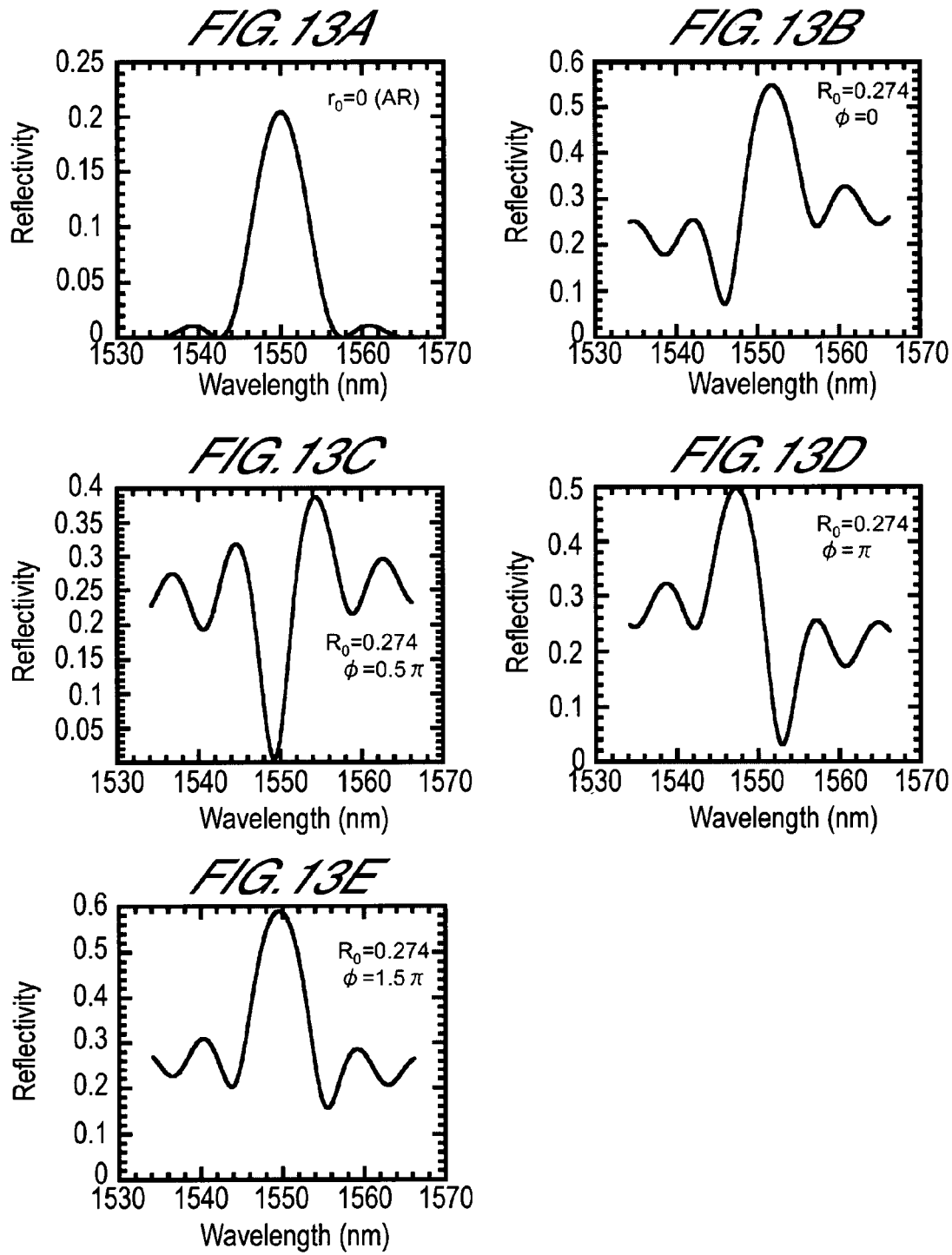

CARRIER-SUPPRESSED OPTICAL PULSE TRAIN GENERATION METHOD AND MODE-LOCKED SEMICONDUCTOR LASER DIODE FOR REALIZING THIS METHOD

BACKGROUND OF THE INVENTION

1. Field of the Invention

The present invention relates to a method for generating a carrier-suppressed optical pulse train and a mode-locked semiconductor laser diode for realizing this method, for generating an optical pulse signal using the intensity modulation of a carrier-suppressed-Return to Zero format.

2. Description of Related Art

Optical communications networks are being improved to transmit information over greater distances and to provide increased capacity. A variety of formats have been proposed for the optical signals used in an optical communications system constituting an optical communications network, and a number of these optical signal formats have been commercialized. A typical commercial optical signal format is the intensity modulation format, which expresses a binary digital signal by strengthening and weakening optical intensity. This intensity modulation format can be broadly divided into two types: the NRZ (Non Return to Zero) format, in which optical intensity is maintained between consecutive "1" signals, and the RZ (Return to Zero) format, in which optical intensity returns to zero one time between consecutive "1" signals.

An optical signal of the RZ format is generated relative to an optical pulse train, in which optical signals stand in a row at regular fixed intervals on a time axis, by using an optical intensity modulator to optically modulate the individual optical pulses constituting this optical pulse train. Optically modulating individual optical pulses constituting an optical pulse train refers to generating a binary digital signal by selectively blocking and transmitting the optical pulses constituting an optical pulse train. Generating an RZ-format optical signal requires the existence of an optical pulse train beforehand, and a light source for generating this optical pulse train is indispensable.

Since an RZ-format optical signal, as described hereinabove, is a binary digital signal, which is achieved by optically modulating an optical pulse train in which optical pulses stand in a row at regular fixed intervals on a time axis, hereinafter, it is supposed that the expressions "optical pulse signal" and "optical pulse train" will be used in the following sense. That is, the expression "optical pulse signal" will only be used to signify a train of optical pulses treated as a binary digital signal, which is achieved by optically modulating a train of optical pulses standing in a row at regular fixed intervals on a time axis. Conversely, the expression "optical pulse train" will be used to designate an aggregate of optical pulses standing defect-free in a row at regular fixed intervals on a time axis.

The RZ format is one in which optical intensity returns to zero one time between consecutive "1" signals, and generally speaking the wavelength band of the light acting as the optical carrier is broader than in the NRZ format. Hereinafter, the wavelength band of the light acting as the optical carrier may also be called the optical pulse signal or the wavelength spectrum band of the optical pulse train.

Since an optical pulse denoting a bit signifying "1" already exists singly on a time axis, an RZ-format optical pulse signal will be constituted as an aggregate of optical pulses having a narrow half-width. Conversely, an NRZ-format optical pulse signal is constituted as a series of wide optical pulses between consecutive "1's" when a bit signifying "1" is expressed consecutively. Thus, the half-width of an optical pulse constituting an NRZ-format optical pulse signal is wider on average than the half-width of an optical pulse constituting an RZ-format optical pulse signal.

Therefore, the frequency band (hereinafter, may also be described as the frequency spectrum band) that an RZ-format optical pulse signal occupies is wider than the frequency spectrum band that an NRZ-format optical pulse signal occupies. In the following explanation, when there is no need to distinguish between a spectrum expressed by a frequency and a spectrum expressed by a wavelength, this frequency spectrum band may also be called simply a spectrum.

When the spectrum band is wide, firstly, there emerges a conspicuous wave form distortion effect, wherein the half-width of an optical pulse on a time axis widens due to the group-velocity dispersion of an optical fiber, which is the transmission medium of a signal, thereby restricting transmission distance. Secondly, when considering increasing capacity using a wavelength division multiplexing system, it becomes necessary to increase the wavelength difference allocated to adjacent channels in order to suppress the crosstalk between channels to which adjacent wavelengths have been allocated. In either case, an optical pulse signal having a wide spectrum band is not desirable from the standpoint of efficiently utilizing the frequency band of an optical communications network in which this optical pulse signal is being used.

Accordingly, methods for narrowing the spectrum band of an RZ-format optical pulse signal have been proposed. A typical such method is one that applies the so-called carrier-suppressed RZ format, in which the RZ format is applied to an optical pulse train, for which the phase of the optical carrier has been inverted between adjacent optical pulses on a time axis (For example, refer to A. Hirano, et al: "A novel mode-splitting detection scheme in 43-Gb/s CS- and DCS-RZ signal transmission," IEEE J. Lightwave Technology, Vol. 20, No. 12, pp. 2029-2034, December 2002, referred to herein as Non-Patent Literature 1). Inverting the phase of the optical carrier between adjacent optical pulses on a time axis is synonymous to saying that the phase difference between adjacent optical pulses is n. Hereinafter, carrier-suppressed RZ format may also be described as CS-RZ format.

Inverting the phase of the optical carrier between adjacent optical pulses on a time axis means that the phase of the optical carrier will not be consecutive, and that a phase jump part, in which the phase of the optical carrier suddenly changes by n, exists between adjacent optical pulses. Therefore, the effect of interference that occurs between adjacent optical pulses is such that the mutual amplitudes of the adjacent optical pulses are offset. Conversely, when the phase of the optical carrier is in-phase between adjacent optical pulses on a time axis, the effect of interference that occurs between these optical pulses is such that the mutual amplitudes are added together.

The CS-RZ format makes it possible to reduce the spectrum band by about 25% compared to an ordinary RZ format for which the phase of the optical carrier between adjacent optical pulses on a time axis is the same (Refer to Non-Patent Literature 1). Thus, the CS-RZ format features outstanding resistance to waveform distortion resulting from the group-velocity dispersion of an optical fiber, and excels at making efficient use of frequency. Furthermore, the CS-RZ format suppresses waveform distortion resulting from interference between adjacent optical pulses on a time axis more than an ordinary RZ format even when the duty cycle of the optical pulse signal is high. Thus, the width on a time axis of an optical pulse constituting an optical pulse signal can be wider than with an ordinary RZ format. As a result, it is possible to reduce the spectrum band of the optical carrier. That is, using a CS-RZ-format optical pulse signal makes it possible to realize an optical communications system with outstanding long-distance transmission characteristics and frequency utilization efficiency.

Here, an optical pulse duty cycle refers to the ratio of the half-widths of pertinent optical pulses relative to the interval of optical pulses lined up adjacently on a time axis (the time width per bit, and may also be called the time slot). Therefore, when the duty cycle is high, it means that the half-width of an optical pulse is wide relative to the time slot. That is, the duty cycle will become high when the time slot is fixed, and the optical pulse half-width widens, or when the optical pulse half-width is fixed, and the time slot narrows.

The following four methods were proposed in the past as methods for generating a CS optical pulse train, which is deemed necessary for generating an optical pulse signal of the CS-RZ format.

The first method is one that uses a Mach-Zehnder interferometer-type $LiNbO_3$ optical intensity modulator (For example, refer to Non-Patent Literature 1). Hereinafter, a $LiNbO_3$ optical intensity modulator may also be described as a LN optical intensity modulator. This method will be explained using an example of the generation of a CS optical pulse train for which the repetitive frequency is 40 GHz. First, a continuance wave (CW) light generated from a CW light source is inputted to an LN optical intensity modulator. Then, if the DC bias level of the LN optical intensity modulator is set to the minimum transmittance voltage value, the repetitive frequency is 20 GHz, and the LN optical intensity modulator is modulated at an electric modulation signal (most often a sine wave) in which the difference of the maximum and minimum voltages (the peak-to-peak voltage, which hereinafter may also be described as $V_{pp}$) is two times the half-wavelength voltage $V_\pi$, a CS optical pulse train with repetitive frequency of 40 GHz is outputted from the LN optical intensity modulator.

According to the first method, changes in optical pulse characteristics are small even when the wavelength of the CW light source changes, thereby making it possible to provide a high-performance, wavelength-variable CS optical pulse train-generating light source. This is due to the small wavelength dependence of the optical modulation characteristics of the LN optical intensity modulator. Further, the first method also has the advantage of making it easy to change the repetitive frequency.

A second method is one that utilizes a mode-locked semiconductor laser diode into which has been integrated a chirped grating, and uses chirped grating dispersion to make the laser oscillate in two modes (For example, refer to K. Sato, et al: "Dual mode operation of semiconductor mode-locked lasers for anti-phase pulse generation," Technical Digest of OFC 2000, paper ThW3-1, 2000, referred to herein as Non-Patent Literature 2). For the sake of expediting the explanation, three longitudinal modes in the vicinity of the Bragg wavelength of the chirped grating are considered here. The frequencies of these three modes, from the low frequency side, are treated as $f_{m-1}$, $f_m$, and $f_{m+1}$. Then, chirped grating dispersion is utilized, and the frequency difference between the m−1 order and m order longitudinal modes ($f_m-f_{m-1}$) and the frequency difference between the m order and m+1 order longitudinal modes ($f_{m+1}-f_m$) are treated as values that are so different that frequency pulling resulting from mode-locked operation does not occur. Here, m is an integer.

When mode locking is imposed on this mode-locked semiconductor laser diode by applying modulation at the frequency ($f_{m+1}-f_m$), the m−1 order mode does not go into mode lock, and does not perform mode-locked oscillation because frequency pulling does not occur. That is, this laser oscillates in two modes, the m order mode and the m+1 order mode. The dual mode oscillation state is the most basic CS optical pulse train generating state. Therefore, this method enables the generation of a CS optical pulse train.

The second method described hereinabove is advantageous in that CS optical pulse train generation can be achieved using a single element, enabling the device for realizing this method to be made smaller and less expensive.

A third method is a more generalized version of the second method described above. That is, it is a method that provides two single-longitudinal-mode oscillation lasers having different wavelengths, and generates a CS optical pulse train of a repetitive frequency equivalent to the wavelength difference of the two lasers by combining the outputs of the two lasers.

The third method is advantageous in that it is possible to change the wavelength and repetitive frequency by changing the wavelengths of the two single-longitudinal-mode oscillation lasers.

A fourth method is one that uses an optical pulse light source and an optical delay interferometer. This method will be explained using an example of the generation of a CS optical pulse train for which the repetitive frequency is 40 GHz. First, an optical pulse light source is provided for generating, at a repetitive frequency of 20 GHz, an ordinary optical pulse train in which the phases of the optical carriers between adjacent optical pulses are uniform. Next, this optical pulse train is divided in two. Using retarding optics, a time delay of 25 ps is applied to one side of this divided optical pulse train at the same time as a phase difference of n is applied as the optical carrier. Thereafter, a CS optical pulse train with a repetitive frequency of 40 GHz is produced by coupling the two sides of the divided optical pulse train. Optical fiber-type retarding optics can be used as the optical divider/coupler and retarding optics, and as disclosed by H. Murai, et al in "EA modulator-based optical multiplexing/demultiplexing techniques for 160 Gbit/s OTDM signal transmission," IEICE Trans. Electron., vol. E88-C, No. 3, pp. 309-318, March 2005, referred to herein as Non-Patent Literature 3, retarding optics of a constitution, which combines a half mirror and spatial optics, can also be used.

However, because the first method requires a CW light source in addition to the LN optical intensity modulator, a device for realizing the first method will be large. Further, the half-wavelength voltage $V_\pi$ of a common LN optical intensity modulator is between 5V and 10V, but since the modulation voltage $V_{pp}$ deemed necessary is $2V_\pi$, the required modulation voltage $V_{pp}$ becomes between 10V and 20V. This makes the impedance of the LN optical intensity modulator 50Ω, which, if converted to electrical power, works out to a large value of between 24 dBm and 30 dBm, meaning that the first method requires high power consumption.

In the second method, as a rule, only a sine wave optical pulse train can be achieved. That is, in the second method, it is not possible to set a flexible pulse width corresponding to system specifications.

In the third method, too, as a rule, only a sine wave optical pulse train can be achieved. Further, in the third method, oscillation must be carried out by phase-locking two lasers, and a control device is needed to realize this phase locking. As a result, a device for realizing the third method is large and expensive.

To realize the fourth method described above requires a light source for generating an ordinary optical pulse train of a frequency that is one-half that of the repetitive frequency of a CS optical pulse train (20 GHz in the example described hereinabove). Here, ordinary optical pulse train refers to an optical pulse train in which the phases of the optical pulses constituting this optical pulse train are equal. In the fourth method, if optical carrier phase control is taken into account, it is necessary to use an optical delay interferometer to execute high-precision optical delay control corresponding to several micrometers in terms of geometric length. That is, the constitution of a device for realizing the fourth method is complex, and requires a high-precision control circuit, making it large and expensive.

Accordingly, an object of the present invention is to provide a CS optical pulse generation method, and more particularly, a CS optical pulse generation method, which is capable of changing the half-width of an optical pulse constituting this CS optical pulse train, and which is small in scale and capable of being carried out using little power.

Further, another object of the present invention is to provide a mode-locked semiconductor laser diode for realizing this method.

Furthermore, in the field of technology for operating a semiconductor laser diode in a mode-locked state, a semiconductor laser diode, which integrally incorporates an optical modulator or other such device that is deemed necessary for realizing mode-locked operation, is used. For this reason, mode-locked is a term signifying an essential laser operating configuration, and a semiconductor laser diode that is designed and manufactured on the premise of carrying out mode-locked operation may be called a mode-locked semiconductor laser diode. Therefore, since the distributed Bragg reflector semiconductor laser, Fabry-Perot external-cavity type semiconductor laser, and ring resonator-type semiconductor laser explained hereinbelow have been designed and manufactured on the premise of carrying out mode-locked operation, they are all mode-locked semiconductor laser diodes.

SUMMARY OF THE INVENTION

In order to achieve the above-mentioned objects, a CS optical pulse train generation method of the following constitution is provided according the gist of the present invention.

The basic operating principle of a first CS optical pulse train generation method of the present invention puts a distributed Bragg reflector semiconductor laser, which comprises a diffraction grating with a Bragg frequency of $f_0$, under mode-locked operation at an oscillation longitudinal mode applied at $f_o \pm q(f_{rep}/2)$ (where q is an odd number) under a condition that outputs an optical pulse train with a repetitive frequency $f_{rep}$. Here longitudinal mode refers to the spectrum of the oscillating light, and may also be called cavity mode.

According to this mode-locked operation, a CS optical pulse train with a repetitive frequency is $f_{rep}$ is outputted from the above-mentioned distributed Bragg reflector semiconductor laser. The Bragg frequency $f_0$ is a value that converts a Bragg wavelength $\lambda_B$ to a frequency. That is, when $\lambda_B$ is treated as a wavelength in a vacuum, and c is treated as the velocity of light, then $f_0 \times \lambda_B = c$.

A first CS optical pulse train generation method of the present invention is one that manipulates a distributed Bragg reflector semiconductor laser through steps (A1) through (C1) below, thereby putting this distributed Bragg reflector semiconductor laser under mode-locked operation and outputting a CS optical pulse train with a repetitive frequency of $f_{rep}$.

(A1): Step for carrying out current injection to form the gain required for the distributed Bragg reflector semiconductor laser to oscillate (Step A1)

(B1): Step for adjusting the oscillation longitudinal mode such that the oscillation longitudinal mode of the distributed Bragg reflector semiconductor laser transitions to $f_0 \pm q(f_{rep}/2)$ (Step B1)

(C1): Step for modulating the oscillation longitudinal mode at the frequency $f_{rep}$ (Step C1) The first CS optical pulse train generation method of the present invention is realized by using a first distributed Bragg reflector semiconductor laser of the present invention.

The first distributed Bragg reflector semiconductor laser is a distributed Bragg reflector semiconductor laser constituted comprising an optical modulation region having a function for modulating optical intensity; a gain region for achieving a population inversion; a phase control region in which the effective index is variable; and a distributed Bragg reflector region in which a diffraction grating with a Bragg frequency of $f_0$ is formed. The optical modulation region, gain region, phase control region and distributed Bragg reflector region are arranged linearly and housed in the cavity.

Step A1, which forms the gain required for the distributed Bragg reflector semiconductor laser to oscillate, is realized by injecting current into the gain region.

The constitution of the distributed Bragg reflector semiconductor laser is such that the effective indices of the phase control region and distributed Bragg reflector region can be adjusted so as to put this distributed Bragg reflector semiconductor laser under mode-locked operation in the oscillation longitudinal mode, which is applied at longitudinal mode $f_0 \pm q(f_{rep}/2)$. Further, the constitution is such that injecting alternating current or applying alternating voltage to the optical modulation region enables the transmittance thereof to be modulated at frequency of $f_{rep}$. That is, this distributed Bragg reflector semiconductor laser can be put under mode-locked operation by adjusting the effective index of at least either one of the phase control region and distributed Bragg reflector region (Step B1), and it is possible to output a CS optical pulse train with a repetitive frequency of $f_{rep}$ from this distributed Bragg reflector semiconductor laser (Step C1).

A second CS optical pulse train generation method of the present invention is implemented using a second distributed Bragg reflector semiconductor laser, which, in addition to an optical modulation region, gain region, phase control region, and distributed Bragg reflector region, further comprises an optical absorption coefficient adjustment region for adjusting an optical absorption coefficient. That is, the second CS optical pulse train generation method is one that manipulates a second distributed Bragg reflector semiconductor laser through the above-mentioned steps (A1), (B1) and (C1), as well as step D2 below, thereby putting this distributed Bragg reflector semiconductor laser under mode-locked operation and outputting a CS optical pulse train with a repetitive frequency of $f_{rep}$.

After the above-mentioned step A1 has been executed, step D2 below is implemented, followed by the execution of step B1 and step C1.

(D2): Step for attenuating reflected light, which is reflected from the cavity facet of the side nearest the distributed Bragg reflector region of the distributed Bragg reflector semiconductor laser, so that this reflected light does not reach this distributed Bragg reflector region (Step D2).

The optical absorption coefficient adjustment region of the second distributed Bragg reflector semiconductor laser is installed between the distributed Bragg reflector region and the cavity facet of the side nearest this distributed Bragg reflector region. That is, the optical modulation region, gain region, phase control region, distributed Bragg reflector region, and optical absorption coefficient adjustment region of the second distributed Bragg reflector semiconductor laser are arranged linearly in that order, and the facet between the optical modulation region and the outside is the first facet, and the facet between the optical absorption coefficient adjustment region and the outside is the second facet. The cavity facet of the side nearest the optical absorption coefficient adjustment region signifies the second facet.

Adjusting an optical absorption coefficient in the optical absorption coefficient adjustment region makes it possible to attenuate the reflected light at the one side cavity facet (second facet) to a sufficient size that will not reach the distributed Bragg reflector region. When this state is achieved, a boundary condition, which establishes the oscillation longitudinal mode of the second distributed Bragg reflector semiconductor laser, is established by a reflection from the first facet and a reflection from the distributed Bragg reflector region, and the second facet does not influence the establishment of the oscillation longitudinal mode of the second distributed Bragg reflector semiconductor laser in the least.

When implementing the first and second CS optical pulse train generation methods of the present invention, preferably the phase control region and distributed Bragg reflector region of the distributed Bragg reflector semiconductor laser should comprises an electrode. Injecting current into the phase control region and distributed Bragg reflector region via this electrode makes it possible to manifest a plasma effect and change the effective index. Further, applying a voltage to the phase control region and distributed Bragg reflector region via this electrode also makes it possible to manifest a Pockels effect and change the effective index.

Besides using the above-mentioned plasma effect and Pockels effect, it is also possible to change the effective index of the phase control region and distributed Bragg reflector region by controlling the temperature. In order to enable this temperature control to be implemented, it is suitable to provide a resistance heating layer in the phase control region and distributed Bragg reflector region.

The basic operating principle of a third CS optical pulse train generation method of the present invention puts a Fabry-Perot external-cavity-type semiconductor laser, which comprises an external cavity comprising a wavelength filter, in which a transmission center wavelength is converted to a frequency of $f_0$, and a multi-electrode laser diode, under mode-locked operation at an oscillation longitudinal mode imposed at $f_0 \pm q(f_{rep}/2)$ (where q is an odd number) under a condition that outputs an optical pulse train with a repetitive frequency of $f_{rep}$. A CS pulse train with a repetitive frequency of $f_{rep}$ is outputted from the above-mentioned Fabry-Perot external-cavity-type semiconductor laser in accordance with this mode-locked operation.

The third CS optical pulse train generation method of the present invention is one that manipulates a Fabry-Perot external-cavity-type semiconductor laser through steps (A3) through (C3) below, thereby putting this Fabry-Perot external-cavity-type semiconductor laser under mode-locked operation and outputting a CS optical pulse train with a repetitive frequency of $f_{rep}$.

(A3): Step for carrying out current injection to form the gain required for the Fabry-Perot external-cavity-type semiconductor laser to oscillate (Step A3)

(B3): Step for adjusting the oscillation longitudinal mode such that the oscillation longitudinal mode of the Fabry-Perot external-cavity-type semiconductor laser transitions to $f_0 \pm q(f_{rep}/2)$ (Step B3)

(C3): Step for modulating the oscillation longitudinal mode at the frequency $f_{rep}$ (Step C3)

The third CS optical pulse train generation method of the present invention is realized by using a Fabry-Perot external-cavity-type semiconductor laser of the present invention as described hereinabove.

The Fabry-Perot external-cavity-type semiconductor laser of the present invention comprises a wavelength filter, in which a transmission center wavelength is converted to a frequency of $f_0$, and a multi-electrode laser diode, which is constituted by linearly arranging an optical modulation region having a function for modulating optical intensity, and a gain region for the formation of a population inversion. This wavelength filter is arranged linearly with this multi-electrode laser diode, and is housed in an external cavity.

Injecting current into the gain region of the multi-electrode laser diode realizes Step A3 for forming the gain required for the Fabry-Perot external-cavity-type semiconductor laser to oscillate.

The constitution of the Fabry-Perot external-cavity-type semiconductor laser is such that the spacing of the external cavity can be adjusted (Step B3) so as to put this Fabry-Perot external-cavity-type semiconductor laser under mode-locked operation in the oscillation longitudinal mode, which is applied at longitudinal mode $f_0 \pm q(f_{rep}/2)$. Further, the constitution is such that applying an alternating voltage equivalent to a frequency of $f_{rep}$ to the optical modulation region makes it possible to modulate the transmittance thereof (Step C3). By putting this Fabry-Perot external-cavity-type semiconductor laser under mode-locked operation, a CS optical pulse train with a repetitive frequency of $f_{rep}$ is outputted from the Fabry-Perot external-cavity-type semiconductor laser.

The basic operating principle of a fourth CS optical pulse train generation method of the present invention puts a ring resonator type semiconductor laser, which comprises a ring resonator, under mode-locked operation at an oscillation longitudinal mode applied at $f_0 \, q(f_{rep}/2)$ under a condition that outputs an optical pulse train with a repetitive frequency of $f_{rep}$. A CS pulse train with a repetitive frequency of $f_{rep}$ is outputted from this ring resonator type semiconductor laser in accordance with this mode-locked operation.

The fourth CS optical pulse train generation method of the present invention is one that manipulates a ring resonator type semiconductor laser comprising a ring resonator through steps (A4) through (C4) below, thereby putting this ring resonator type semiconductor laser under mode-locked operation and outputting a CS optical pulse train with a repetitive frequency of $f_{rep}$.

(A4): Step for carrying out current injection to form the gain required for the ring resonator type semiconductor laser to oscillate (Step A4)

(B4): Step for adjusting the oscillation longitudinal mode such that the oscillation longitudinal mode of the ring resonator type semiconductor laser transitions to $f_0 \pm q(f_{rep}/2)$ (Step B4)

(C4): Step for modulating the oscillation longitudinal mode at frequency $f_{rep}$ (Step C4)

The fourth CS optical pulse train generation method of the present invention is realized by using a ring resonator type semiconductor laser of the present invention as described hereinabove.

The ring resonator type semiconductor laser of the present invention is constituted comprising a wavelength filter, in which a transmission center wavelength is converted to a frequency of $f_0$, a multi-electrode laser diode, which is constituted by linearly arranging an optical modulation region having a function for modulating optical intensity, and a gain region for the formation of a population inversion, and a variable optical delay device for changing an optical length. The wavelength filter, multi-electrode laser diode, and variable optical delay device are housed in the ring resonator type semiconductor laser.

Injecting current into the gain region of the multi-electrode laser diode realizes step A4 for forming the gain required for the ring resonator type semiconductor laser to oscillate.

The constitution of the ring resonator type semiconductor laser is such that the roundtrip cavity length of the ring resonator can be adjusted (Step B4) so as to put this ring resonator-type semiconductor laser under mode-locked operation in an oscillation longitudinal mode, which is applied at longitudinal mode $f_0 \pm q(f_{rep}/2)$. Further, the constitution is such that applying an alternating voltage equivalent to the frequency $f_{rep}$ to the optical modulation region makes it possible to modulate the transmittance thereof (Step C4). By putting this ring resonator-type semiconductor laser under mode-locked operation, a CS optical pulse train with a repetitive frequency of $f_{rep}$ is outputted from the ring resonator-type semiconductor laser.

The basic invention of the first and second CS optical pulse train generation methods is a method for generating a CS optical pulse train with a repetitive frequency of $f_{rep}$ by putting a first distributed Bragg reflector semiconductor laser comprising a diffraction grating with a Bragg frequency og $f_0$ under mode-locked operation at an oscillation longitudinal mode applied at $f_0 \pm q(f_{rep}/2)$. Details will be explained hereinbelow, but imposing mode-locked operation at an oscillation longitudinal mode applied at $f_0 \pm q(f_{rep}/2)$ achieves the advantageous effect of making it possible to output a CS optical pulse train with a repetitive frequency of $f_{rep}$ from a distributed Bragg reflector semiconductor laser.

The first CS optical pulse train generation method is realized by a first distributed Bragg reflector semiconductor laser as follows.

In step A1, population inversion, which is the condition for the first distributed Bragg reflector semiconductor laser to oscillate, is formed in the gain region by the injection of current. Implementing step A1 puts the first distributed Bragg reflector semiconductor laser in the oscillating state.

In step B1, the oscillation condition of the distributed Bragg reflector semiconductor laser is established by adjusting the effective index of at least either one of the effective indices of the phase control region and distributed Bragg reflector region, and the condition necessary for mode-locked operation with an oscillation longitudinal mode of $f_0 \pm q(f_{rep}/2)$ is completed. That is, when the first distributed Bragg reflector semiconductor laser oscillates in this state, there is no correlation among oscillation longitudinal modes, but oscillating light with an oscillation longitudinal mode of $f_0 \pm q(f_{rep}/2)$ is capable of being outputted.

In step C1, modulating the transmittance of the optical modulation region at the frequency $f_{rep}$ makes it possible to put the first distributed Bragg reflector semiconductor laser under mode-locked operation. That is, it becomes a state in which a fixed correlation is introduced among the oscillation longitudinal modes. Oscillating the first distributed Bragg reflector semiconductor laser in a state that maintains a fixed correlation among oscillation longitudinal modes makes it possible to output an optical pulse train with a repetitive frequency of $f_{rep}$.

The second CS optical pulse train generation method is realized by a second distributed Bragg reflector semiconductor laser as follows. The second CS optical pulse train generation method, similar to the first CS optical pulse train generation method, is also a method for generating a CS optical pulse train with a repetitive frequency of $f_{rep}$ by putting a second distributed Bragg reflector semiconductor laser under mode-locked operation at an oscillation longitudinal mode applied at $f_0 \pm q(f_{rep}/2)$.

The point of difference with the first CS optical pulse train generation method is the incorporation of step D2, which sets the value of an optical absorption coefficient of the optical absorption coefficient adjustment region to a size sufficient to prevent reflected light from the cavity facet of the side of the optical absorption coefficient adjustment region from reaching the distributed Bragg reflector region. Therefore, the second distributed Bragg reflector semiconductor laser for realizing the second CS optical pulse train generation method comprises an optical absorption coefficient adjustment region.

Executing this step D2 makes it possible to set the value of an optical absorption coefficient of the optical absorption coefficient adjustment region to a size sufficient to prevent reflected light from the cavity facet of the side of the optical absorption coefficient adjustment region from reaching the distributed Bragg reflector region. Accordingly, preventing the reflected light from the cavity facet of the side of the optical absorption coefficient adjustment region from reaching the distributed Bragg reflector region produces the following advantageous effect. That is, preventing the reflected light from reaching the distributed Bragg reflector region is equivalent to the fact that the reflectivity of the cavity facet of the distributed Bragg reflector region (cleavage plane) is 0. Therefore, a CS optical pulse train can be reliably generated without being affected by the residual reflection of the cavity facet of the side of the distributed Bragg reflector region. When residual reflection of the cavity facet of the side of the distributed Bragg reflector region exists, it becomes difficult to generate a CS optical pulse train as a train of regular optical pulses.

The third CS optical pulse train generation method differs from the first and second CS optical pulse train generation methods in that it uses a Fabry-Perot external-cavity type semiconductor laser instead of a distributed Bragg reflector semiconductor laser. The component that corresponds to the distributed Bragg reflector region comprised in the distributed Bragg reflector semiconductor laser utilized in the first and second CS optical pulse train generation methods is a wavelength filter comprised in the Fabry-Perot external-cavity type semiconductor laser. Further, in the first and second CS optical pulse train generation methods, adjusting the effective index of at least either one of the effective indices of the phase control region and distributed Bragg reflector region sets the oscillating condition of the distributed Bragg reflector semiconductor laser, but in the third CS optical pulse train generation method, adjusting the spacing of the external cavity sets the oscillating condition of the Fabry-Perot external-cavity type semiconductor laser.

In the third CS optical pulse train generation method as well, the basic operating principle for generating a CS optical pulse train is the same as the basic operating principle in the first and second CS optical pulse train generation methods. That is, putting a Fabry-Perot external-cavity type semiconductor laser under mode-locked operation at an oscillation longitudinal mode applied at $f_0 \pm q(f_{rep}/2)$ under a condition that outputs an optical pulse train with a repetitive frequency of $f_{rep}$ achieves the advantageous effect of generating a CS optical pulse train with a repetitive frequency of $f_{rep}$.

A fourth CS optical pulse train generation method is a method for generating a CS optical pulse train by putting a ring resonator-type semiconductor laser under mode-locked operation. The component that corresponds to the distributed Bragg reflector region comprised in the distributed Bragg reflector semiconductor laser utilized in the first and second CS optical pulse train generation methods, similar to the third CS optical pulse train generation method, is a wavelength filter comprised in the ring resonator-type semiconductor laser. Further, in the fourth CS optical pulse train generation method, adjusting the amount of optical delay of a variable optical delay device arranged in the ring resonator adjusts the roundtrip cavity length of the ring resonator so as to put this ring resonator type semiconductor laser under mode-locked operation at an oscillation longitudinal mode, which is applied at the oscillation longitudinal mode of $f_0 \pm q(f_{rep}/2)$.

In the fourth CS optical pulse train generation method as well, the basic operating principle for generating a CS optical pulse train is the same as that of the first through third CS optical pulse train generation methods described hereinabove. That is, putting the ring resonator-type semiconductor laser under mode-locked operation at an oscillation longitudinal mode applied at $f_0 \pm q(f_{rep}/2)$ under a condition that outputs an optical pulse train with a repetitive frequency of $f_{rep}$ achieves the advantageous effect of generating a CS optical pulse train with a repetitive frequency of $f_{rep}$.

In the third and fourth CS optical pulse train generation methods, the operations for modulating at the frequency $f_{rep}$ deemed necessary for mode-locked operation (step (C1) and step (C4)) can be realized by simultaneously modulating the transmittance of the optical modulation region at the frequency $f_{rep}$.

As explained hereinabove, according to the first through fourth CS optical pulse train generation methods, it is possible to generate a CS optical pulse train with a repetitive frequency $f_{rep}$ by putting a distributed Bragg reflector semiconductor laser, Fabry-Perot external-cavity type semiconductor laser, and ring resonator-type semiconductor laser, which are utilized in the respective methods, under mode-locked operation at an oscillation longitudinal mode applied at $f_0 \pm q(f_{rep}/2)$.

BRIEF DESCRIPTION OF THE DRAWINGS

The foregoing and other objects, features and advantages of the present invention will be better understood from the following description taken in connection with the accompanying drawings, in which:

FIG. 1 is simplified block diagrams of a mode-locked semiconductor laser diode of a first embodiment, FIG. 1A being a diagram showing an example for changing the effective indices of a phase control region and a distributed Bragg reflector region using the plasma effect or the Pockels effect, and FIG. 1B being a diagram showing an example for changing the effective indices of a phase control region and a distributed Bragg reflector region in accordance with a temperature change;

FIG. 2 is a diagram showing a time waveform of a CS optical pulse train;

FIG. 13 is diagrams showing the energy reflectivity of a distributed Bragg reflector, FIG. 13A through FIG. 13E respectively showing situations in which changes are made to the reflectivity $R_0$ of the cleavage plane and the initial phase $\Phi$ of the diffraction grating as parameters;

DESCRIPTION OF THE PREFERRED EMBODIMENTS

Figure 3A:
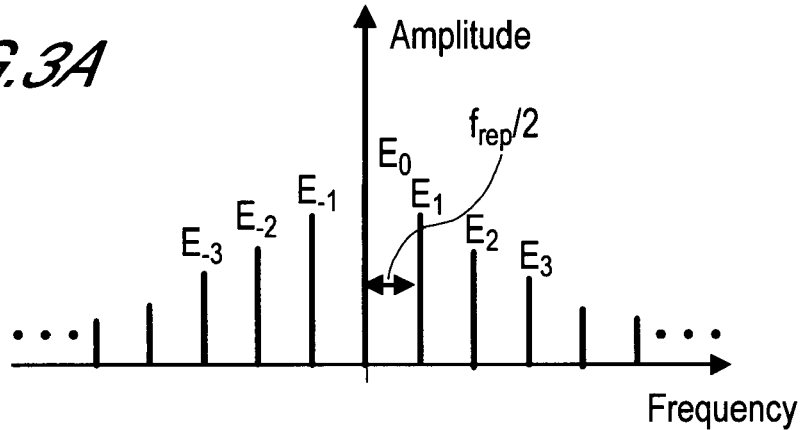
FIG. 3 is diagrams provided to illustrate the frequency spectrums of CS optical pulse trains, FIG. 3A being a diagram showing the frequency spectrum of a first optical pulse train with a repetitive frequency of $f_{rep}/2$, FIG. 3B being a diagram showing the frequency spectrum of a second optical pulse train, in which the repetitive frequency is $f_{rep}/2$, and the phase of the carrier is shifted by n relative to the first optical pulse train, and FIG. 3C being a diagram showing the frequency spectrum of an optical pulse train achieved by synthesizing the first and second optical pulse trains.

The embodiments of the present invention will be explained hereinbelow by referring to the figures. Furthermore, the respective figures simply diagram examples of constitutions related to the present invention, schematically showing the positional relationship of the respective components to the extent necessary to be able to understand the present invention, and the present invention is not limited to the examples shown in the figures. Further, specific materials and conditions are used in the following explanation, but these materials and conditions merely constitute suitable examples, and as such, the present invention is in no way limited thereto. Further, the same reference numerals are assigned to the same components in the respective figures, and duplicate explanations of these same components may be omitted.

First Embodiment

The constitution of a first distributed Bragg reflector semiconductor laser for realizing a first CS optical pulse train generation method will be explained by referring to FIG. 1A and FIG. 1B. Further, the mode-locked operating principle of this first distributed Bragg reflector semiconductor laser will also be explained. FIG. 1A and FIG. 1B are both diagrams for explaining a first mode-locked semiconductor laser diode, that is, diagrams for explained a simplified structure of a distributed Bragg reflector semiconductor laser for realizing a first CS optical pulse train generation method.

FIG. 1A shows an enlarged cross-sectional view of a distributed Bragg reflector semiconductor laser for realizing changes to the effective indices of the optical waveguides of a phase control region and a distributed Bragg reflector region by virtue of the plasma effect or the Pockels effect. Further, FIG. 1B shows an enlarged cross-sectional view of a distributed Bragg reflector semiconductor laser for realizing changes to the effective indices of the optical waveguides of a phase control region and a distributed Bragg reflector region by virtue of temperature changes. In the following explanation, the effective indices of the optical waveguides of a phase control region and a distributed Bragg reflector region may also simply be called the effective indices of a phase control region and a distributed Bragg reflector region.

Since only one part of the structure of the phase control region and a distributed Bragg reflector region of the distributed Bragg reflector semiconductor laser shown in FIG. 1A and FIG. 1B is different, the same components will be explained by assigning the same reference numerals.

A distributed Bragg reflector semiconductor laser of a first embodiment is a mode-locked semiconductor laser diode in which a natural number multiple of the cavity roundtrip frequency approximates the repetitive frequency $f_{rep}$ of a generated optical pulse train. Here, approximates signifies that the difference between a natural number multiple of the cavity roundtrip frequency of a distributed Bragg reflector semiconductor laser and the repetitive frequency $f_{rep}$ of an optical pulse train is small enough to generate the frequency pulling necessary for putting this distributed Bragg reflector semiconductor laser under mode-locked operation.

A distributed Bragg reflector semiconductor laser 100 for realizing a first CS optical pulse train generation method comprises an optical modulation region 10, gain region 12, phase control region 14, and distributed Bragg reflector region 16 connected linearly in that order. Double heterostructure optical waveguides 10a, 12a, 14a, and 16a, which are sandwiched between a p-side cladding layer 20 and a n-side cladding layer 22, are formed in each of the respective regions. In the distributed Bragg reflector semiconductor laser 100, the intensity of an oscillating light is modulated (loss modulated) by propagating through the optical waveguide 10a, and is amplified by virtue of stimulated emission by propagating through the waveguide 12a, and the phase velocity of this oscillating light is changed by propagating through the waveguide 14a, and is subjected to Bragg reflection in the waveguide 16a. The modulation of the oscillating light can be carried out using loss modulation like this, but it is also possible to carry out gain modulation in the waveguide 12a.

The optical modulation region 10, gain region 12, phase control region 14, and distributed Bragg reflector region 16 signify structures that are constituted by optical waveguides sandwiched between a p-side cladding layer 20 and a n-side cladding layer 22, and which comprise p-side and a n-side electrodes. That is, if the optical modulation region 10 is given as an example and explained, the optical modulation region 10 refers to the whole region comprising the part of the optical modulation region made up of the p-side electrode 24 and p-side cladding layer 20 of the optical modulation region, the part of the optical modulation region made up of the optical waveguide 10a and n-side cladding layer 22 of the optical modulation region, and the part of the optical modulation region made up of the n-side common electrode 32. The same holds true for the gain region 12, phase control region 14 and distributed Bragg reflector region 16 as well.

The population inversion needed for laser oscillation is formed, and gain is generated in the gain region 12 by using a constant current source 38 to inject current via the p-side electrode 26 and n-side common electrode 32 (Step A1). Further, the optical modulation required to express mode locking is carried out in the optical modulation region 10 (Step C1). To generate the optical modulation of the optical modulation region 10, there is a method, which injects current into this region, and a method, which applies voltage to this region.

The current-injection method can be implemented by injecting between the p-side electrode 24 and the n-side common electrode 32 a current, which is the sum of a constant current supplied from a constant current source 34, and an alternating current 36 with a frequency of $f_{rep}$ supplied from an alternating current power source 36 combined via a coupler 58.

Further, the voltage-application method for generating the optical modulation in the optical modulation region 10 can be implemented by using the coupler 58 to combine a constant voltage supplied from a constant voltage source 34, and an alternating voltage 36 with a frequency of $f_{rep}$ supplied from an alternating current power source 36, and applying same between the p-side electrode 24 and the n-side common electrode 32.

The phase control region 14 and distributed Bragg reflector region 16 are constituted from a material that is transparent to the laser oscillating wavelength. For example, in the case of a InGaAsP semiconductor laser diode with a laser oscillating wavelength in the 1.55 μm band, the phase control region 14 and distributed Bragg reflector region 16 are constituted from an InGaAsP layer with a band gap wavelength of 1.3 μm.

Further, the laser oscillating wavelength is not limited to this example, and can also be a laser oscillation wavelength of 1.1 μm or 1.48 μm. In this case, the mixed crystal ratio of InGaAsP is selected so as to be transparent corresponding to this laser oscillating wavelength, and used to form the phase control region 14 and distributed Bragg reflector region 16. Further, a material other than InGaAsP can also be used in accordance with the oscillation wavelength of the distributed Bragg reflector semiconductor laser 100. It is also possible to constitute the distributed Bragg reflector semiconductor laser 100 that achieves the oscillating wavelength deemed necessary in accordance with the oscillating wavelength of the distributed Bragg reflector semiconductor laser 100 by selecting a material with a band gap that corresponds to this oscillation wavelength.

A diffraction grating 18 is formed either in the p-side cladding layer 20 in the vicinity of the boundary between the distributed Bragg reflector region optical waveguide 16a and p-side cladding layer 20, or in the n-side cladding layer 22 in the vicinity of the boundary between the distributed Bragg reflector region optical waveguide 16a and n-side cladding layer 22. FIG. 1A and FIG. 1B show examples in which a diffraction grating 18 is formed in the p-side cladding layer 20 in the vicinity of the boundary between the distributed Bragg reflector region optical waveguide 16a and p-side cladding layer 20. Vicinity of the boundary, as used here, signifies the range attained by the evanescent field of the light that is guided through the distributed Bragg reflector region 16.

As described hereinabove, modulating the optical modulation region 10 and gain region 12 using current or voltage puts the distributed Bragg reflector semiconductor laser 100 under mode-locked operation, and generates an optical pulse train with a repetitive frequency of $f_{rep}$. As shown in FIG. 1A, it is possible to use a constant current source and constant voltage source 40 and 42 to respectively inject constant current or apply reverse bias voltage to both the phase control region 14 and the distributed Bragg reflector region 16 via the respective phase control region p-side electrode 28 and distributed Bragg reflector region p-side electrode 30, and the n-side common electrode 32. Accordingly, in the case of constant current injection, the effective indices of both the phase control region 14 and the distributed Bragg reflector region 16 can be adjusted using the plasma effect. Further, in the case of the application of a reverse bias voltage, the effective indices of both the phase control region 14 and the distributed Bragg reflector region 16 can be adjusted using Pockels effect.

It is possible to adjust the effective indices of both the phase control region 14 and the distributed Bragg reflector region 16 (Step B1) such that, of the longitudinal modes of the distributed Bragg reflector semiconductor laser 100, the two longitudinal modes $f_0+(f_{rep}/2)$ and $f_0-(f_{rep}/2)$, which are close to the Bragg frequency $f_0$ of the distributed Bragg reflector region 16, that is, both longitudinal modes constitute a symmetrical relationship to the Bragg frequency on a frequency axis.

Adjusting the effective indices of both the phase control region 14 and the distributed Bragg reflector region 16 can also be realized using a procedure other than the procedure shown in FIG. 1A. FIG. 1B shows an example of the elemental structure of a distributed Bragg reflector semiconductor laser 200 according to this other procedure. The distributed Bragg reflector semiconductor laser 200 differs from the elemental structure of the distributed Bragg reflector semiconductor laser 100 shown in FIG. 1A in that a SiO$_2$ or other such dielectric layer 48 is respectively formed on the surface of the p-side cladding 20 of both the phase control region 14 and the distributed Bragg reflector region 16, and Pt or other such resistance heating layers 50 and 54 are respectively formed thereon. Current is respectively applied to these resistance heating layers 50 and 54 using constant current sources 52 and 56 to generate Joule heat and change the effective indices of the phase control region 14 and the distributed Bragg reflector region 16 by changing the temperature.

A CS optical pulse train can be outputted from both the cavity facet 44 of the distributed Bragg reflector region 16 side and the cavity facet 46 of the optical modulation region 10 side of the distributed Bragg reflector semiconductor lasers 100 and 200, and a CS optical pulse train that is outputted from either facet can be put to practical use. Further, it is desirable to apply a nonreflective layer to the cavity facet 44 of the distributed Bragg reflector region 16 side.

To explain the operating principle of a distributed Bragg reflector semiconductor laser in a first CS optical pulse generation method, first the characteristic features of a time waveform of a CS optical pulse train will be explained by referring to FIG. 2. FIG. 2 is a diagram showing a time waveform of the carrier amplitude envelope forming a CS optical pulse train, the horizontal axis denotes the time, and the vertical axis denotes the optical intensity. However, the vertical axis indicates that the optical intensity of a first optical pulse, which will be explained hereinbelow, takes the positive direction, and the optical intensity of a second optical pulse train, the carrier phase of which deviates by n from the optical pulses that constitute a first optical pulse train, takes the negative direction.

An optical pulse observed as a change in optical intensity is expressed as an envelope of an amplitude waveform of the electrical field vector of the carrier light. Therefore, in the following explanation, an optical pulse time waveform will be expressed as an amplitude waveform envelope of an electrical field vector of light.

A CS optical pulse train is an optical pulse train in which the carrier phases between the optical pulses lined up adjacently on a time axis are in an opposite phase relationship to one another. That is, the phase difference of the two as carriers between the optical pulses lined up adjacently on a time axis is a relationship equivalent to π.

If it is supposed that the time waveform cycle $T_{rep}$ of the CS optical pulse train on the time axis is $1/f_{rep}$ (a repetitive frequency of $f_{rep}$), the time waveform of this CS optical pulse train can be considered to be a synthesized waveform of a first optical pulse train with a cycle of $2T_{rep}$ ($=2/f_{rep}$) and a second optical pulse train with a cycle of $2T_{rep}$ ($=2/f_{rep}$).

Here, as shown in FIG. 2, the first optical pulse train is an optical pulse train with a cycle of $2T_{rep}$ (repetitive frequency of $f_{rep}/2$), and the optical phases of the carriers between the adjacent optical pulses are in-phase. Further, the second optical pulse train is an optical pulse train with a cycle of $2T_{rep}$, the optical phases of the carriers between the adjacent optical pulses are in-phase, the optical pulse train is generated at a timing that deviates by $T_{rep}$ ($=1/f_{rep}$) from the first optical pulse train, and the optical phase of this carrier is the reverse of the first optical pulse train (there is a phase difference of π).

Figure 3B:
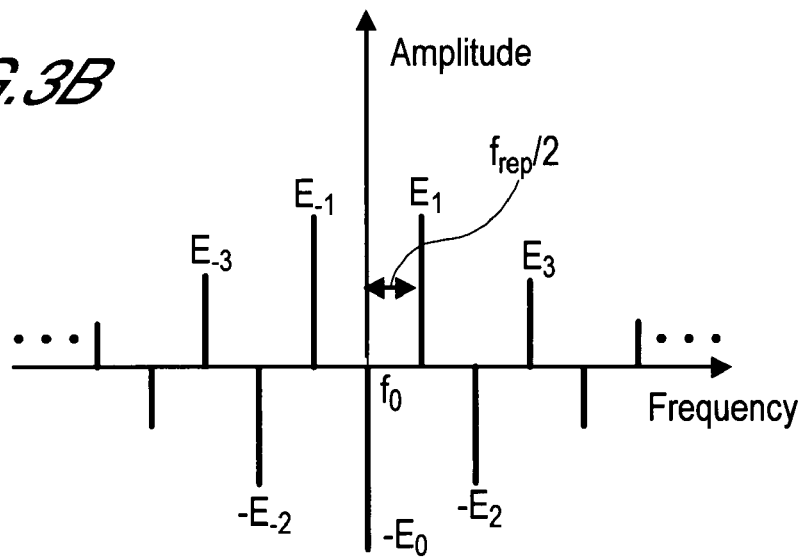
Figure 3C:
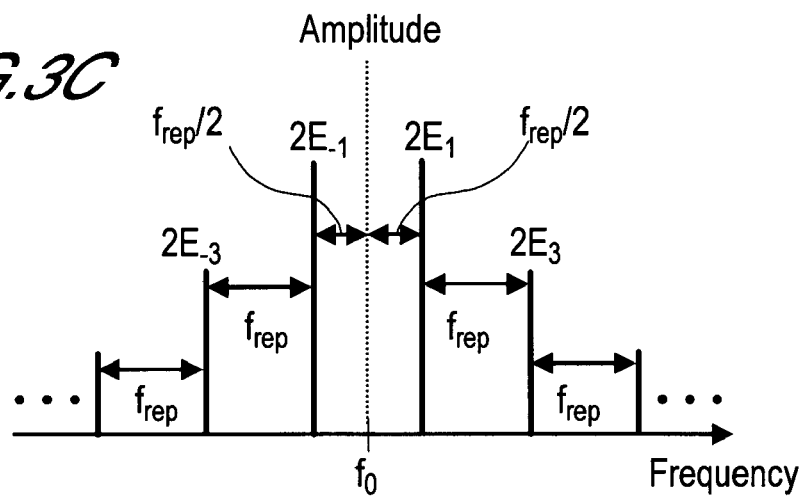

A frequency spectrum of a CS optical pulse train will be explained by referring to FIG. 3A through FIG. 3C. FIG. 3A is a diagram showing the frequency spectrum of a first optical pulse train with a repetitive frequency of $f_{rep}/2$. FIG. 3B is a diagram showing the frequency spectrum of a second optical pulse train with a repetitive frequency of $f_{rep}/2$, and a carrier phase that is out-of-phase by n relative to the first optical pulse train. FIG. 3C is a diagram showing the frequency spectrum of an optical pulse train achieved by synthesizing the first and second optical pulse trains. In FIG. 3A through FIG. 3C, the horizontal axis represents the carrier frequency. Further, the vertical axis shows the size of the respective amplitudes of the components of the frequency spectrum, and shows that the amplitudes of the frequency spectrum components of the first optical pulse train take the positive direction, and the amplitudes of the frequency spectrum components, which are out-of-phase by π from these frequency spectrum components, take the negative direction.

The amplitude waveform of the frequency spectrum of the first optical pulse train, as shown in FIG. 3A, is a waveform, which, if it is supposed that the carrier frequency is $f_0$, a longitudinal mode of frequency $f_0$ is made the center of the waveform, and longitudinal modes with amplitudes of $E_m$ are all in-phase, and exist discretely on the frequency axis separated by $f_{rep}/2$. Here, m is an integer, and amplitude $E_0$, in which m=0, is equivalent to the amplitude component of the carrier frequency of the first optical pulse train. Here, a longitudinal mode of frequency $f_0$ and a longitudinal mode with an amplitude of $E_m$ respectively signify the amplitude component of a frequency spectrum with a frequency of $f_0$ and the amplitude component of a frequency spectrum with an amplitude of $E_m$.

The amplitude waveform of the spectrum of the second optical pulse train, as shown in FIG. 3B, is a waveform, which, similar to the spectrum of the first optical pulse train, makes a longitudinal mode of frequency $f_0$ the center of the waveform, and longitudinal modes with amplitude absolute values of $E_m$ exist discretely on the frequency axis separated by a frequency of $f_{rep}/2$. Here, m is an integer, and amplitude $E_0$, in which m=0, is equivalent to the amplitude component of the carrier frequency of the second optical pulse train. However, the second optical pulse train is generated at a timing that deviates by $T_{rep}$ ($=1/f_{rep}$) from the first optical pulse train (first requirement), and the phase of this carrier is the reverse of that of the first optical pulse train (second requirement). Phase reversal is the same meaning as the phase difference of the two being π.

Because the first requirement is that the second optical pulse train be generated at a timing that deviates by $T_{rep}$ ($=1/f_{rep}$) from the first optical pulse train, the phases of the respective longitudinal modes of the second optical pulse train are out-of-phase by π with the longitudinal mode phase of the first optical pulse train with respect to longitudinal modes for which m is an odd number. That is, the plus-minus of an amplitude is reversed relative to a longitudinal mode for which m is an odd number. Further, in accordance with the second requirement, by which the carrier phase of the second optical pulse train is the reverse of that of the first optical pulse train, the phases of all the longitudinal modes of the second optical pulse train are out-of-phase by π with respect to the longitudinal mode phase of the first optical pulse train.

As a result of satisfying the first and second requirements, the amplitude waveform of the spectrum of the second optical pulse train is a waveform which reverses the plus-minus of an amplitude relative to the spectrum of the first optical pulse train with regard to a longitudinal mode for which m is an even number. Therefore, the amplitude waveform of the spectrum of a CS optical pulse train, which is a synthesized waveform of the first optical pulse train and the second optical pulse train, is the waveform shown in FIG. 3C. That is, the amplitude waveform of the spectrum of a CS optical pulse train is a spectrum waveform in which longitudinal modes having mode orders that are even numbers and comprising carrier frequency components evanesce, and only longitudinal modes having mode orders that are odd numbers exist discretely separated by a frequency of $f_{rep}$.

Furthermore, the name CS optical pulse train derives from the fact that it is a optical pulse train generated by evanescing longitudinal modes of a specified order number (here, odd-number order longitudinal modes) from among the carrier frequency components of this optical pulse train, that is, by suppressing the carrier (carrier suppressed).

As described hereinabove, the relationship between the time waveform and frequency spectrum of a CS optical pulse train is given in FIG. 2 and FIG. 3C, That is, as shown in FIG. 2, the time waveform of the CS optical pulse train is optical pulses that are lined up in a relationship in which the phase difference of the two carriers between the adjacent optical pulses is equivalent to π. Further, the longitudinal mode components that constitute the frequency spectrum of a CS optical pulse train, as shown in FIG. 3C, have a longitudinal mode of the frequency $f_0$ at the center, even-number order longitudinal modes comprising carrier frequency components evanesce, and only odd-number order longitudinal modes discretely exist separated by the frequency $f_{rep}$. That is, the frequency spectrum of a CS optical pulse train is made up of frequency components (longitudinal mode components), which are given as $f_0 \pm q(f_{rep}/2)$ where q is an odd number.

Next, the following is an explanation of the relationship between the time waveform and the frequency spectrum waveform of the CS optical pulse train explained hereinabove from the viewpoint of generating a CS optical pulse train comprising a time waveform and frequency spectrum like this.

The amplitude time waveform $e_{cs}(t)$ of a CS optical pulse train is given by the following equation (1).

$$e_{cs}(t) = \sum_m E_m e^{i2\pi\left\{f_0 t + m\frac{f_{rep}}{2} t\right\}} + \sum_m E_m e^{i2\pi\left\{f_0 t + m\frac{f_{rep}}{2}(t - T_{rep}) + \pi\right\}} \quad (1)$$

The first term of equation (1) gives the amplitude time waveform of a first optical pulse train, and the second term gives the amplitude time waveform of a second optical pulse train. Here, the optical pulse period, which is the interval between adjacent optical pulses on a time axis, is expressed by $T_{rep}$. That is, $T_{rep}$ has a mutually reciprocal relationship with the repetitive frequency $f_{rep}$ of the optical pulse train, where $T_{rep}=1/f_{rep}$.

Equation (1) can be transformed into the following equation (2).

$$e_{cs}(t) = e^{i2\pi f_0 t} \sum_m E_m e^{im\pi f_{rep} t}\{1 - e^{im\pi}\} \quad (2)$$

Here, since $(1-\exp(im\pi))$ expressed in equation (2) is 0 when m is an even number, a term in equation (2) in which m is an even number vanishes, and as a result of this, $e_{cs}(t)$ which denotes the amplitude time waveform of the CS optical pulse train, is expressed by the next equation (3).

$$e_{cs}(t) = 2e^{i2\pi\left(f_0 + \frac{f_{rep}}{2}\right)t} \sum_m E_{2m+1} e^{i2\pi m f_{rep} t} \quad (3)$$

That is, the even-number order longitudinal modes evanesce, and a time waveform comprising only odd-number order longitudinal modes corresponding to the spectrum waveform shown in FIG. 3C is obtained.

Here, the spectrum and time waveform of a CS optical pulse train, expressed in FIG. 3C and equation (3), will be considered further.

Introducing a progress $A_m$, which is defined by the relationship given in equation (4) below, transforms the above-mentioned equation (3) into the form of the subsequent equation (5).

$$E_{2m+1} \equiv A_m + A_{-(m+1)} \quad (4)$$

$$e_{cs}(t) = 2e^{i2\pi\left(f_0 + \frac{f_{rep}}{2}\right)t} \sum_m (A_m + A_{-(m+1)})e^{i2\pi m f_{rep} t} \quad (5)$$

$$= 2e^{i2\pi\left(f_0 + \frac{f_{rep}}{2}\right)t} \sum_m A_m e^{i2\pi m f_{rep} t} +$$

$$2e^{i2\pi\left(f_0 + \frac{f_{rep}}{2}\right)t} \sum_m A_{-(m+1)} e^{i2\pi m f_{rep} t}$$

Here, equation (6) below is achieved by carrying out a conversion in which (m+1) is replaced by n in the second term of equation (5).

$$e_{cs}(t) = 2e^{i2\pi\left(f_0 + \frac{f_{rep}}{2}\right)t} \sum_m A_m e^{i2\pi m f_{rep} t} + 2e^{i2\pi\left(f_0 - \frac{f_{rep}}{2}\right)t} \sum_n A_{-n} e^{i2\pi n f_{rep} t} \quad (6)$$

Equation (6) can be interpreted as follows. The following explanation will be given by referring to FIG. 4A through FIG. 4C and FIG. 5A through FIG. 5C.

Figure 4A:
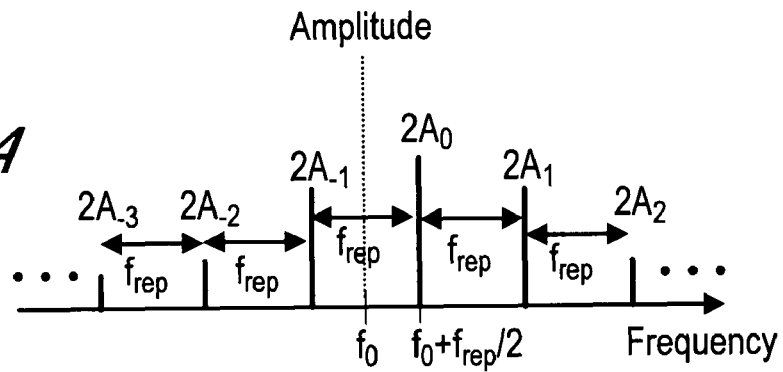
FIG. 4 is diagrams showing frequency spectrums of a third and fourth optical pulse trains and a combined optical pulse train, FIG. 4A being a diagram showing the frequency spectrum of a third optical pulse train, FIG. 4B being a diagram showing the frequency spectrum of a fourth optical pulse train, and FIG. 4C being a diagram showing the frequency spectrum of a combined optical pulse train.
Figure 4B:
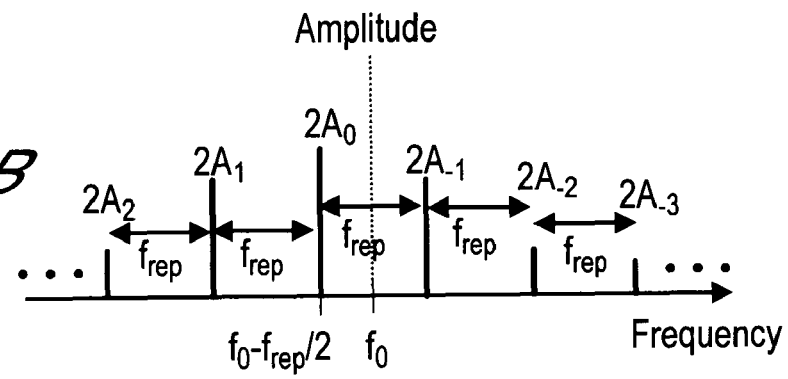
Figure 4C:
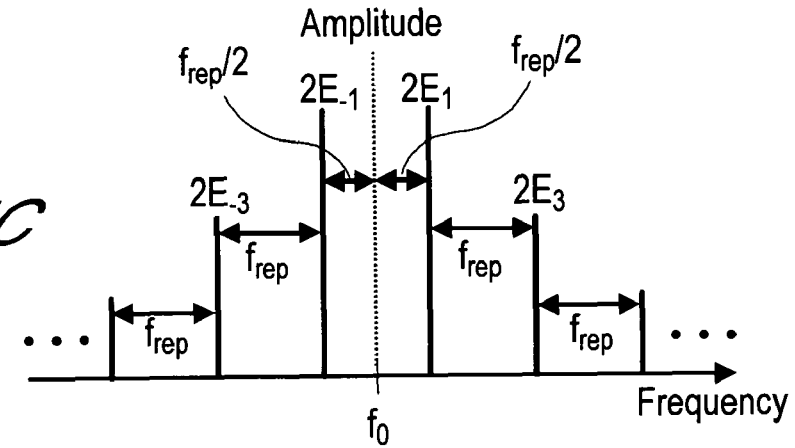

FIG. 4A through FIG. 4C are diagrams showing frequency spectrums of a third and fourth optical pulse trains and a combined optical pulse train, FIG. 4A being a diagram showing the frequency spectrum of a third optical pulse train, FIG. 4B being a diagram showing the frequency spectrum of a fourth optical pulse train, and FIG. 4C being a diagram showing the frequency spectrum of a combined optical pulse train, which combines the third optical pulse train and the fourth optical pulse train. In FIG. 4A through FIG. 4C, the horizontal axis represents frequency, and the vertical axis represents amplitude size, both of which are shown on arbitrary scales.

Figure 5A:
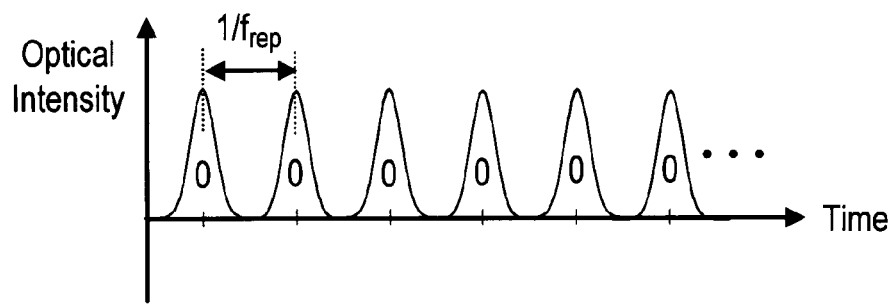
FIG. 5 is diagrams showing time waveforms of a third and fourth optical pulse trains and a combined optical pulse train, FIG. 5A being a diagram showing the time waveform of a third optical pulse train, FIG. 5B being a diagram showing the time waveform of a fourth optical pulse train, and FIG. 5C being a diagram showing the time waveform of a combined optical pulse train.
Figure 5B:
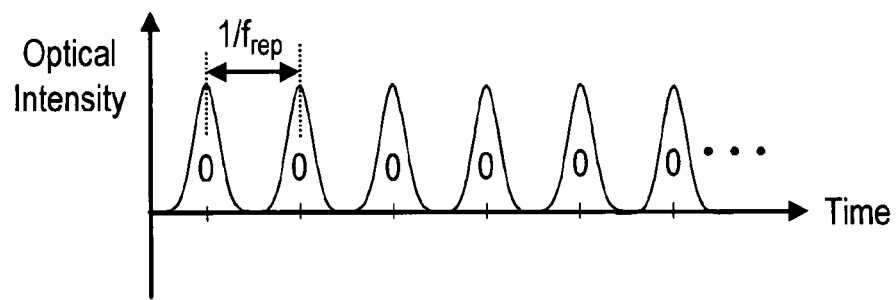
Figure 5C:
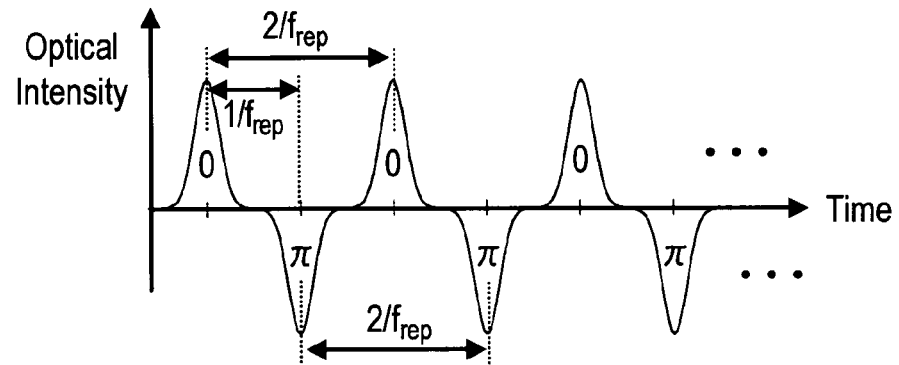

Further, FIG. 5A through FIG. 5C are diagrams showing time waveforms of a third and fourth optical pulse trains and a combined optical pulse train, FIG. 5A being a diagram showing the time waveform of a third optical pulse train, FIG. 5B being a diagram showing the time waveform of a fourth optical pulse train, and FIG. 5C being a diagram showing the time waveform of a combined optical pulse train, which combines the third optical pulse train and the fourth optical pulse train. In FIG. 5A through FIG. 5C, the horizontal axis represents time, and the vertical axis represents optical intensity, both of which are shown on arbitrary scales. However, the vertical axis of FIG. 5C indicates that the optical intensities of the third and fourth optical pulse trains, which will be explained hereinbelow, take the positive direction, and the optical intensity of the optical pulses, for which the carrier phase is out-of-phase by $\pi$ with the optical pulses constituting the third and fourth optical pulse trains, takes the negative direction.

According to equation (6), the spectrum of the CS optical pulse train is given as a synthesized waveform of the third optical pulse train and the fourth optical pulse train. Here, the third optical pulse train, as shown in FIG. 4A, comprises spectrum waveforms, for which the center frequency of the carrier thereof is $f_0+(f_{rep}/2)$, and as the starting point of this frequency, the amplitude of the mth longitudinal mode (where m is an integer) is $2A_m$, and the waveforms exist discreetly on a frequency axis separated by a frequency of $f_{rep}$. That is, the frequency of the mth longitudinal mode with an amplitude of $2A_m$ is $f_0+q(f_{rep}/2)$, wherein q is an odd number (provided that q=2m+1). Further, the fourth optical pulse train, as shown in FIG. 4B, comprises spectrum waveforms, for which the center frequency of the carrier thereof is $f_0-(f_{rep}/2)$, and as the starting point of this frequency, the amplitude of the mth longitudinal mode (where m is an integer) is $2A_{-m}$, and the waveforms exist discreetly on a frequency axis separated by a frequency of $f_{rep}$. The frequency of the mth longitudinal mode with an amplitude of $2A_{-m}$ is $f_0-q(f_{rep}/2)$, wherein q is an odd number (provided that q=2m+1).

As given in equation (6), and as shown in FIG. 4A and FIG. 4B, the longitudinal mode amplitudes of the spectrum of the third optical pulse train and the spectrum of the fourth optical pulse train comprise mutually anti-symmetrical spectrum shapes relative to the frequencies. Further, in the respective third optical pulse train and fourth optical pulse train, the phases of the respective longitudinal modes specified by the value of m are in-phase.

This signifies that the phases between the optical pulses constituting the third optical pulse train are uniform, and that the phases between the optical pulses constituting the fourth optical pulse train are uniform. Further, if the third optical pulse train and fourth optical pulse train are compared, the phases of the respective carrier components are in-phase with one another. This signifies that the optical pulses respectively constituting the third optical pulse train and the fourth optical pulse train are generated simultaneously.

Therefore, the frequency spectrum of the combined optical pulses of the third and fourth optical pulse trains is as shown in FIG. 4C.

If the above-described content is presented as a time waveform relationship, it becomes the relationship shown in FIG. 5A through FIG. 5C. FIG. 5A through FIG. 5C show the time waveform of an optical pulse train. That is, if the third optical pulse train, which is shown in FIG. 5A, and which is an ordinary RZ optical pulse train with an optical carrier frequency of $f_0+(f_{rep}/2)$ and a repetitive frequency of $f_{rep}$, and the fourth optical pulse train, which is shown in FIG. 5B, and which is an ordinary RZ optical pulse train with an optical carrier frequency of $f_0-(f_{rep}/2)$ and a repetitive frequency of $f_{rep}$, are generated at the same timing, the synthesized time waveform thereof constitutes the CS-RZ optical pulse train shown in FIG. 5C.

The first and second CS optical pulse train generation methods of the present invention are methods that realize the above-described state by putting a distributed Bragg reflector semiconductor laser comprising a distributed Bragg reflector region under mode-locked operation. The relationship between the characteristics of a distributed Bragg reflector region, which plays a vital role in realizing the above-described state, and a longitudinal mode (may also be called a cavity mode) of a distributed Bragg reflector semiconductor laser will be explained hereinbelow by referring to FIG. 6.

Figure 6:
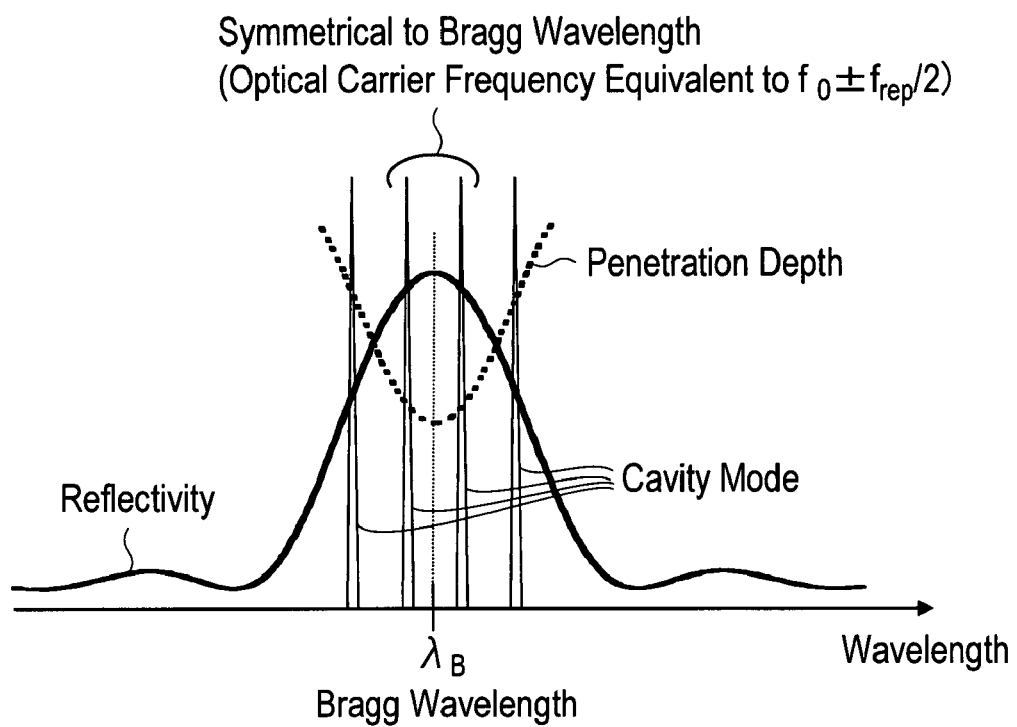
FIG. 6 is a diagram provided to illustrate the relationship of a reflectivity spectrum of a distributed Bragg reflector region, penetration depth and longitudinal mode.

FIG. 6 is a diagram provided to illustrate the relationship of the reflectivity spectrum (thick line), penetration depth (broken line), and longitudinal mode (thin line) of a distributed Bragg reflector region, and the wavelength is calibrated and displayed on the horizontal axis via an arbitrary scale. Further, the vertical axis is omitted, but the reflectivity spectrum and optical intensity of the longitudinal modes, which are depicted using solid lines, and the length of the penetration depth, which is depicted using a broken line, are respectively displayed in the vertical axis direction via arbitrary scales.

The explanation here assumes an ideal state, in which the facet reflectivity of the cavity facet 44 on the distributed Bragg reflector region 16 side is 0. If the facet reflectivity of the cavity facet 44 is 0, the state is such that the oscillation operation of the distributed Bragg reflector semiconductor laser can be determined purely on the reflection characteristics of the diffraction grating without having to take into account the affect of the facet reflection of the cavity facet 44. Further, penetration depth signifies $L_{eff}$ when the phase $\Phi$ of the reflected light from the distributed Bragg reflector region 16 is defined by equation (7) below.

$$\Phi = 2n_{DBR}k_0L_{eff} \quad (7)$$

As used here, $n_{DBR}$ is the effective index of the distributed Bragg reflector region, and $k_0$ is the wave number. As shown in FIG. 6, if the facet reflectivity of the cavity facet 44 is 0, the profiles of the reflectivity and penetration depth (wavelength dependence) are symmetrical relative to the Bragg wavelength $\lambda_B$ on the wavelength axis.

Consideration is given here to a situation in which, of the longitudinal modes of the distributed Bragg reflector semiconductor laser, the two longitudinal modes (value converted to wavelength) nearest the Bragg wavelength $\lambda_B$ ($f_0$ in terms of frequency) exist in a location that is symmetrical to the Bragg wavelength $\lambda_B$ on the wavelength axis shown in FIG. 6. The frequency spacing of the two longitudinal modes coincides with the cavity roundtrip frequency, and this approximates the repetitive frequency ($f_{rep}$) of the generated CS optical pulse train. Here, approximates signifies that the difference between the frequency spacing of the two longitudinal modes and the $f_{rep}$ is small enough that frequency pulling occurs when the distributed Bragg reflector semiconductor laser is put under mode-locked operation.

It is supposed that the distributed Bragg reflector semiconductor laser performs lasing in this state. In this case, because the local maximum reflectivity of the distributed Bragg reflector region and the local minimum penetration depth of the above-mentioned two longitudinal modes are symmetrically located relative to the Bragg wavelength, and moreover, both extreme values approximate the Bragg wavelength, both the two longitudinal modes and the lasing conditions are the same, and this distributed Bragg reflector semiconductor laser generates laser oscillation at the above-mentioned two longitudinal modes. When mode-locked operation is imposed in this state, this laser comprises a frequency, which corresponds to the respective wavelengths of the respective above-mentioned two longitudinal modes, giving rise to dual-wavelength mode-locked operation.

Furthermore, in the frequency profiles of the reflectivity and penetration depth in the distributed Bragg reflector region, the local maximum reflectivity and local minimum penetration depth thereof exist in locations that are symmetrical with one another relative to the frequency in terms of the Bragg wavelength being converted to frequency, and the profiles themselves are identical in shape. Further, when mode-locked operation occurs, frequency pulling occurs mutually between the light of these two wavelengths (the light of the frequencies corresponding to the above-mentioned two longitudinal modes) through sideband modulation. As a result of this, the frequency spacing of these two optical carriers is fixed at the modulation frequency, that is, at $f_{rep}$, and the phase locking thereof is also realized. Therefore, the wavelength difference of the mode-locked pulse trains of these two wavelengths coincides exactly with the repetitive frequency ($f_{rep}$), and because phase locking is also taking place, the generation times also coincide.

As described hereinabove, because a distributed Bragg reflector semiconductor laser, which is put under mode-locked operation under a condition in which the facet reflectivity of the cavity facet 44 shown in FIG. 6 is 0, meets the CS optical pulse train generation conditions explained by referring to FIG. 4A through FIG. 4C and FIG. 5A through FIG. 5C above, a CS optical pulse train is generated.

In order to realize the first and second CS optical pulse train generation methods, the distributed Bragg reflector semiconductor laser must be set such that the two longitudinal modes nearest to the Bragg wavelength are arranged symmetrically to the Bragg wavelength on a wavelength axis. The laser longitudinal mode wavelength is determined via the following equation (8) for a distributed Bragg reflector semiconductor laser of the constitution shown in FIG. 1A and FIG. 5B.

$$m\lambda = 2n_{mod}L_{mod} + 2n_{gain}L_{gain} + 2n_{pc}L_{pc} + 2n_{DBR}L_{eff} \quad (8)$$

Here, $n_{mod}$, $n_{gain}$, $n_{pc}$ and $n_{DBR}$ respectively represent the optical modulation region 10, gain region 12, phase control region 14 and distributed Bragg reflector region 16. Further, $L_{mod}$, $L_{gain}$, and $L_{pc}$ respectively represent the region lengths of the optical modulation region 10, gain region 12 and phase control region 14. $L_{eff}$ is the penetration depth of the distributed Bragg reflector region 16.

As shown in equation (8), changing at least either one of $n_{pc}$ or $n_{DBR}$ makes it possible to change a longitudinal mode wavelength (Step B1).

To realize the first CS optical pulse train generation method using a distributed Bragg reflector semiconductor laser of the constitution shown in FIG. 1A, a constant current source or constant voltage source 40 and 42 are respectively used to inject constant current or apply reverse bias voltage to both the phase control region 14 and the distributed Bragg reflector region 16 via the respective p-side electrodes 28 and 30, and the n-side common electrode 32, thereby changing $n_{pc}$ and $n_{DBR}$. That is, it is possible to adjust the effective indices of $n_{pc}$ and $n_{DBR}$ in accordance with the plasma effect in the case of constant current injection, and in accordance with the Pockels effect in the case of the application of a reverse bias voltage, such that the two longitudinal modes in the proximity of the Bragg wavelength of the distributed Bragg reflector region 16 are arranged symmetrically to the Bragg wavelength on a frequency axis. Arranged symmetrically to the Bragg wavelength on a frequency axis signifies that one of the frequencies corresponding to the two longitudinal modes is smaller than the Bragg frequency, and the other one is larger than the Bragg frequency, and the differences between the two frequencies and the Bragg frequency are equal.

In the distributed Bragg reflector semiconductor laser shown in FIG. 1B, a $SiO_2$ or other such dielectric layer 48 is formed on the surface of the p-side cladding 20 of both the phase control region 14 and the distributed Bragg reflector region 16, and Pt or other such resistance heating layers 50, 54 are formed thereon. Applying current to these resistance heating layers 50, 54 using both constant current sources 52 and 56 to generate Joule heat and change the temperature adjusts the effective indices of $n_{pc}$ and $n_{DBR}$ such that, as shown in FIG. 6, the two longitudinal modes in the proximity of the Bragg wavelength of the distributed Bragg reflector region 16 are arranged symmetrically to the Bragg wavelength.

According to the first CS optical pulse train generation method, it is possible to generate a CS optical pulse train using a single semiconductor laser diode element the same as the method disclosed in Non-Patent Literature 2, which uses a mode-locked semiconductor laser diode into which has been integrated a chirped grating. The pulse shape of this generated CS optical pulse train differs from the case of the mode-locked semiconductor laser diode disclosed in Non-Patent Literature 2, and is not limited to a sine wave. In other words, this means it is possible to change the half-width of an optical pulse.

The reason for this is as follows. That is, according to the method discussed in Non-patent Literature 2, a generated CS optical pulse train is generated by two lasing longitudinal modes such that the shape of the time waveform of an optical pulse constituting the generated CS optical pulse train is limited to a sine wave.

Conversely, according to the first CS optical pulse train generation method, the number of oscillation longitudinal modes in this spectrum is not limited to two modes, so that the shape of the time waveform of an optical pulse constituting the generated CS optical pulse train is not limited to a sine wave. In other words, this is because an optical pulse constituting a CS optical pulse train generated by the first CS optical pulse train generation method is constituted by not less than two frequency components of $f_0 \pm q(f_{rep}/2)$, and is not limited to q=1.

Thus, the advantage of the time waveform shape of an optical pulse constituting a CS optical pulse train is a waveform other than a sine wave, for example, lies in the following fact. That is, providing either strong gain or absorption modulation in the optical modulation region 10, and setting the reflectivity profile realized in the distributed Bragg reflector region 16 to a wide bandwidth makes it possible to generate a CS optical pulse train with a narrow optical pulse width. Or, by contrast, providing a weak gain and absorption modulation in the optical modulation region 10 makes it possible to generate a CS optical pulse train with a wide optical pulse width. In other words, the advantage is that the width of an optical pulse constituting a generated CS optical pulse train can be set arbitrarily.

By applying a direct current voltage to the optical modulation region 10 as a bias voltage, and superimposingly applying a modulated voltage thereto, it is possible to easily generate a CS optical pulse train with a variable pulse width. That is, making the optical modulation region 10 function as an electro-absorption modulator, also called an EA modulator, makes it possible to easily generate a variable pulse width CS optical pulse train. The reason for this will be explained by referring to FIG. 7A through FIG. 7C.

Figure 7A:
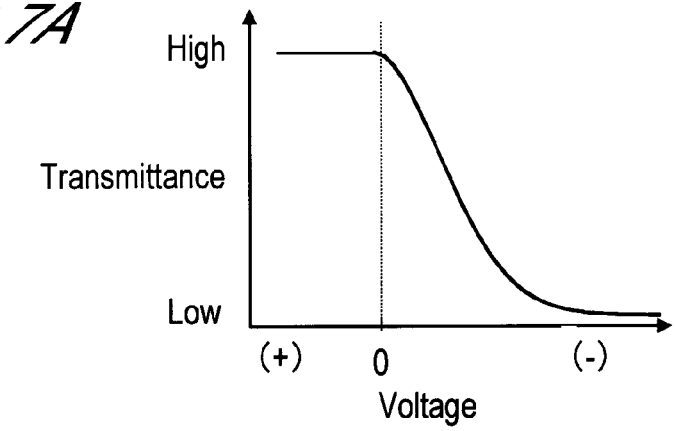
FIG. 7 is diagrams provided to illustrate the relationship between the characteristics of an EA modulator and an optical gate waveform, FIG. 7A being a diagram showing transmittance relative to EA modulator voltage, FIG. 7B being a diagram provided to illustrate optical gate characteristics when an applied direct current voltage is set to the forward bias side, and a modulation voltage is superimposed thereon, and FIG. 7C being a diagram provided to illustrate optical gate characteristics when an applied direct current voltage is set to the reverse bias side, and a modulation voltage is superimposed thereon.
Figure 7B:
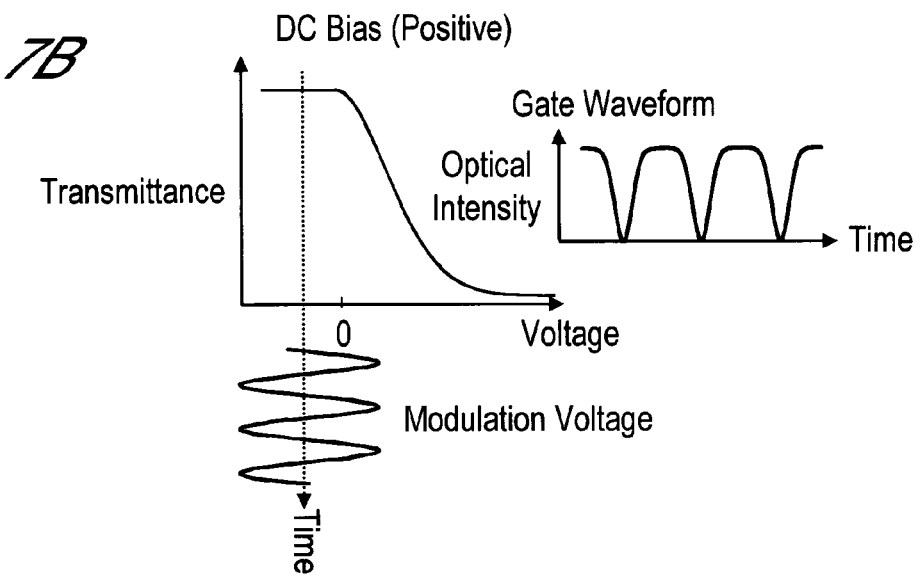
Figure 7C:
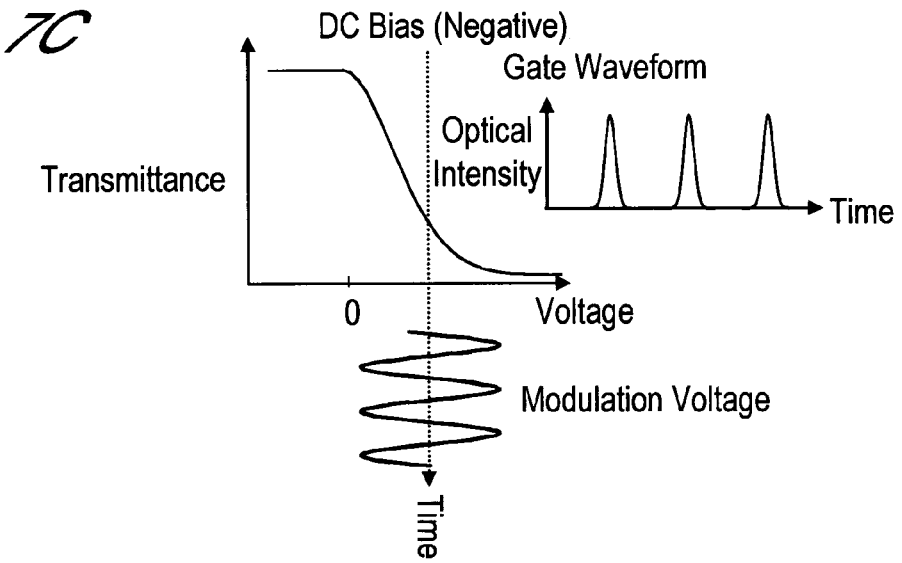

FIG. 7A through FIG. 7C are diagrams provided to illustrate the relationship between the characteristics of an EA modulator and an optical gate waveform, FIG. 7A being a diagram showing transmittance relative to EA modulator voltage, FIG. 7B being a diagram provided to illustrate optical gate characteristics when an applied direct current voltage is set to the forward bias side, and a modulation voltage is superimposed thereon, and FIG. 7C being a diagram provided to illustrate optical gate characteristics when an applied direct current voltage is set to the reverse bias side, and a modulation voltage is superimposed thereon.

In FIG. 7A through FIG. 7C, the horizontal axis shows the voltage applied to an EA modulator on an arbitrary scale, a (+) denotes a forward voltage, and a (−) denotes a reverse voltage. The vertical axis shows transmittance on an arbitrary scale. Further, FIG. 7B and FIG. 7C respectively show, as gate waveforms on the right side, time waveforms of the intensity of output light outputted from an EA modulator when the EA modulator is adopted as a gate element.

As shown in FIG. 7A, when a reverse bias voltage is applied to an EA modulator, an effect, by which the bandgap wavelength of the semiconductor constituting the EA modulator shifts to the longer wavelength side, is expressed, and the amount of absorption increases. This increase in the amount of absorption exhibits characteristics by which the increase is not linear with respect to the applied voltage, but rather, increases more rapidly, and consequently, when the EA modulator is subjected to reverse bias voltage, the transmittance changes rapidly relative to the applied voltage. Conversely, when a forward bias voltage is applied to the EA modulator, the change in transmittance is very small due to the bandgap wavelength of the semiconductor constituting the EA modulator being set to a wavelength that is shorter by between 50 nm and 100 nm than the usable wavelength.

Here, the optical gate characteristics of the EA modulator as gate element when a direct current voltage applied to the EA modulator is set to the forward bias side and a modulation voltage is superimposed thereon are as shown in FIG. 7B, and a wide-pulse-width optical gate characteristic, having a characteristic by which the time during which optical intensity is ON (time when light is transmitted) is longer than the time when optical intensity is OFF (time when light is blocked), is achieved. If a distributed Bragg reflector semiconductor laser, in which the optical modulation region 10 is structured as an EA modulator, is driven under this driving condition to implement the first CS optical pulse train generation method, it becomes possible to generate a CS optical pulse train having a wide pulse width. Since the optical gate characteristics change when the direct current voltage and modulation voltage are changed, it is possible to vary the pulse width of a generated CS optical pulse train.

Conversely, the optical gate characteristics of the EA modulator as gate element when a direct current voltage applied to the EA modulator is set to the reverse bias side and a modulation voltage is superimposed thereon are as shown in FIG. 7C, and a narrow-pulse-width optical gate characteristic having a characteristic by which the time during which optical intensity is OFF is longer than the time when optical intensity is ON, is achieved. If a distributed Bragg reflector semiconductor laser, in which the optical modulation region 10 is structured as an EA modulator, is driven under this driving condition to implement the second CS optical pulse train generation method, it becomes possible to generate a CS optical pulse train having a narrow pulse width. Further, changing the direct current voltage and modulation voltage makes it possible to vary the pulse width of a generated CS optical pulse train.

Because a mode-locked laser has characteristics by which a mode-locked optical pulse circles around inside the laser cavity, the gain and absorption modulation effect that occur in the optical modulation region are generated a plurality of times for a single optical pulse. Therefore, even if the one-time gain and absorption modulation are not strong, an optical pulse grows each time it circles around inside the cavity by the above-described multiple modulation effect. In the case of an active mode-locked laser, the strength of the gain and absorption modulation changes in accordance with an applied modulation voltage. This signifies that, thanks to the multiple modulation effect in an active mode-locked laser, a sufficient gain and absorption modulation effect can be guaranteed for generating an optical pulse even with a low modulation voltage.

Further, if the EA modulator structure described hereinabove is employed as the optical modulation region 10, the quenching characteristic relative to the applied voltage thereof is steeper than in the LN optical intensity modulator utilized in Non-Patent Literature 1. That is, an absorption modulation effect suitable for imposing mode-locked operation is achieved at a lower modulation voltage than in an LN optical intensity modulator. In other words, by making combined use of the steepness of the quenching characteristic with respect to a voltage applied to an EA modulator and the multiple modulation effect in mode-locked operation, it is possible to generate a CS optical pulse train at a markedly lower modulation voltage than the CS optical pulse train generation method that uses an LN optical intensity modulator disclosed in Non-Patent Literature 1. Hereinafter, an optical modulation region that employs an EA modulator structure may also be called an electro-absorption optical modulation region.

Next, an experiment for verifying the first CS optical pulse train generation method and the results thereof will be explained. The verification experiment was conducted by putting a distributed Bragg reflector semiconductor laser under active mode-locked operation as disclosed in the literature (S. Arahira and Y. Ogawa: "40 GHz actively mode-locked distributed Bragg reflector laser diode module with an impedance-matching circuit for efficient RF signal injection," Jpn. J. Appl. Phys., Vol. 43, No. 4B, pp. 1960-1964, 2004). The distributed Bragg reflector semiconductor laser employs an EA modulator structure in the optical modulation region.

The distributed Bragg reflector semiconductor laser utilized in the verification experiment is an InP multi-electrode laser diode element in which the length of the electro-absorption optical modulation region is 165 µm, the length of the gain region is 610 µm, the length of the phase control region is 110 µm, and the length of the distributed Bragg reflector region is 50 µm. The length of the cavity is 1,065 µm, and the cavity roundtrip frequency is approximately 40 GHz. The gain region is a quantum well structure, and more particularly, is a multiple quantum well structure formed from a quantum well layer of InGaAsP having a 0.6% compressive strain, and an unstrained InGaAsP barrier layer. The respective percentage by composition and thickness of the quantum well layer and barrier layer are set so that this multiple quantum well structure achieves a photoluminescence peak wavelength of 1562 nm.

In the waveguide layers of the electro-absorption optical modulation region, phase control region and distributed Bragg reflector region, bulk InGaAsP layers in which the percentage by composition of the respective layers and the respective thicknesses thereof are set so that the photoluminescence peak wavelength constitutes 1465 nm. Further, the cavity facet of the distributed Bragg reflector region side comprises a thin film of Al2O3, and is covered by a nonreflective coating with reflectivity of approximately 2%. The oscillation threshold value for injecting current into the gain region of the distributed Bragg reflector semiconductor laser and causing it to lase is roughly 30 mA, and the slope efficiency, which is the ratio of the output optical intensity to the injection current is around 0.1 W/A. These oscillation threshold and slope efficiency values are typical values for a laser diode.

Figure 8A:
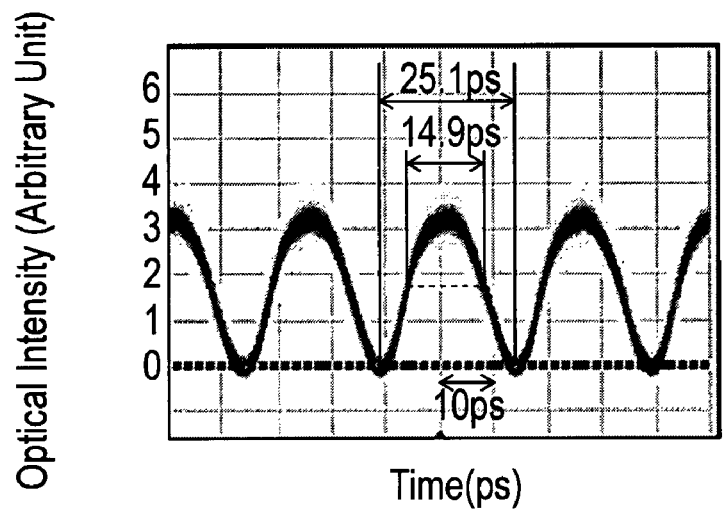
FIG. 8 is diagrams provided to illustrate the test results of CS optical pulse train generation of the first embodiment, FIG. 8A being a diagram showing the time waveform of a generated CS pulse train, and FIG. 8B being a diagram showing a spectrum waveform.
Figure 8B:
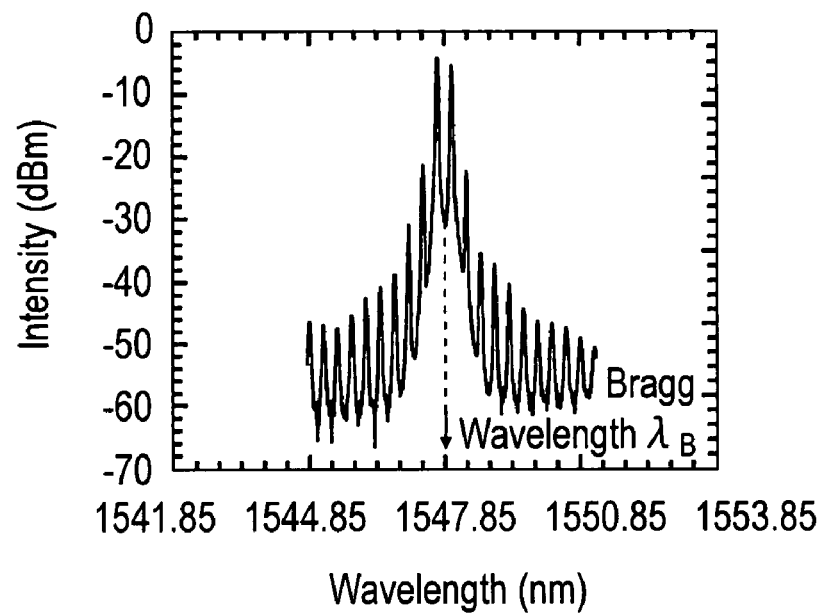

CS optical pulse train generation experiment results for the first embodiment will be explained by referring to FIG. 8A and FIG. 8B. FIG. 8A and FIG. 8B are diagrams provided to illustrate the experiment results of CS optical pulse train generation of the first embodiment, FIG. 8A being a diagram showing the time waveform of a generated CS pulse train, and FIG. 8B being a diagram showing a spectrum waveform. The horizontal axis of FIG. 8A represents time on a graduated scale of 10 ps per unit, and the vertical axis represents optical intensity in arbitrary units. The horizontal axis of FIG. 8B represents wavelengths on a graduated scale in nm units, and the vertical axis represents laser oscillation spectrum intensity on a graduated scale in dBm units.

FIG. 8A and FIG. 8B respectively show the time waveform of a CS optical pulse train and the spectrum waveform of oscillating light. These time waveform and oscillating light spectrum were observed under the following conditions. That is, the gain region was injected with 71 mA of current, the phase control region was injected with 3.25 mA of current, and a forward bias voltage of +0.39V and a modulation voltage with a repetitive frequency of 39.81312 GHz and a modulation voltage intensity of +2.4 dBm were applied to the electro-absorption optical modulation region.

First, as shown in FIG. 8B, the oscillating light spectrum indicates a spectrum shape peculiar to a CS optical pulse train, in which the central spectrum component (part corresponding to the Bragg wavelength $\lambda_B$ of the spectrum curve) is the local minimum, and is bilaterally symmetrical around the Bragg wavelength in the center of the wavelength axis. It is thus clear that a CS optical pulse train has been generated. That is, longitudinal mode spectrum peaks are standing in bilateral symmetry on either side of the Bragg wavelength $\lambda_B$ in the center.

Further, based on the time waveform of the CS optical pulse train shown in FIG. 8A, the pulse width is estimated to be 14.9 ps. The duty cycle, which is a value obtained by dividing the pulse width by the pulse period, is estimated to be 59.3% (14.9/25.1=0.593). Despite a high duty cycle such as this, the optical intensity drops to zero (0) between consecutive optical pulses (The optical intensity transitions to 0 midway between the peak positions of adjacent optical pulses). This, too, is a characteristic feature of a CS optical pulse train, that is, it indicates that because the phase inverts between consecutive optical pulses, interference causes the intensity to drops to 0 midway between consecutive optical pulses.

Figure 9:
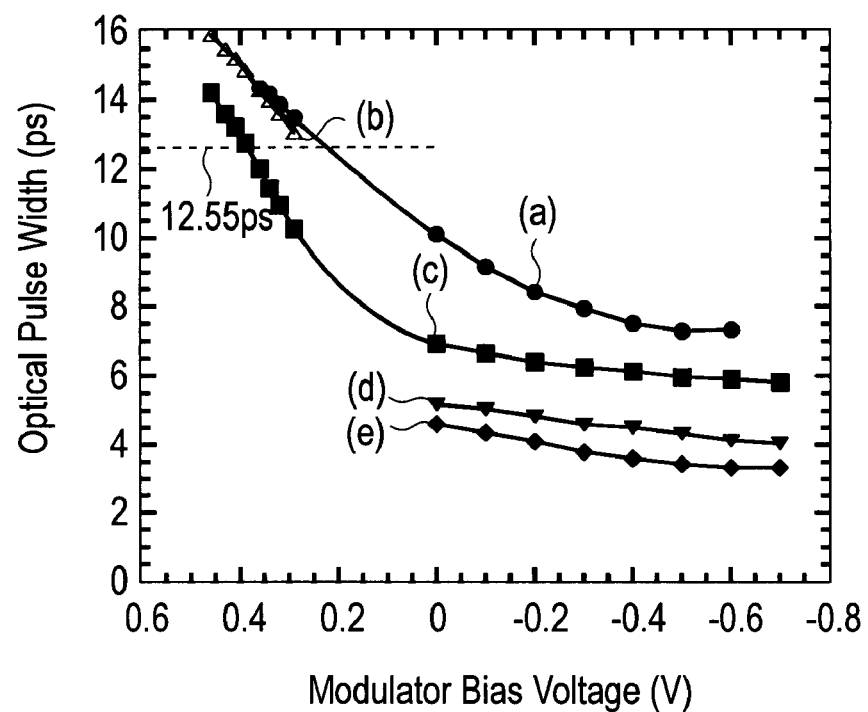
FIG. 9 is a diagram showing the modulator bias voltage and modulator voltage dependence of the optical pulse width of a CS optical pulse train outputted from a mode-locked semiconductor laser diode of the first embodiment.

The results of an experiment on pulse width variable characteristics when a change is made to the bias voltage and modulation voltage intensity applied to the electro-absorption optical modulation region will be explained by referring to FIG. 9. FIG. 9 is a diagram showing the modulator bias voltage and modulator voltage dependence of the optical pulse width of a CS optical pulse train outputted from a distributed Bragg reflector semiconductor laser of the first embodiment. In FIG. 9, the horizontal axis represents modulator bias voltage on a graduated scale in voltage (V) units, and the vertical axis represents the half-width of an optical pulse, which constitutes an optical pulse train outputted from a distributed Bragg reflector semiconductor laser on a graduated scale in ps (picosecond) units. FIG. 9 respectively shows circumstances in which (a) the RF (radio frequency) signal intensity is −1.1 dBm, (b) the RF signal intensity is +2.4 dBm, (c) the RF signal intensity is +7.4 dBm, (d) the RF signal intensity is +15.9 dBm, and (e) the RF signal intensity is +18.1 dBm.

In the examples shown in FIG. 9, it was possible for the half-width of an optical pulse to vary within a range from 3.3 ps to 15.9 ps. Based on the results shown in FIG. 9, the RF signal intensity deemed necessary for modulating the transmittance of the electro-absorption optical modulation region is not more than +7.4 dBm when assuming the generation of a CS optical pulse train with a duty cycle of 50% (in this case, the pulse width is 12.55 ps), which is ordinarily used in an optical communications system that utilizes an RZ format optical pulse signal generated by modulating a CS optical pulse train. As shown in FIG. 9, it is clear that an RF signal intensity of not more than +7.4 dBm is sufficient for generating a CS optical pulse train with a pulse width of 12.55 ps.

This is a value of roughly between $1/50^{th}$ and $1/200^{th}$ of the value (between 24 dBm and 30 dBm) of the CS optical pulse train generation method that utilizes a LN optical intensity modulator in Non-Patent Literature 1, which is the prior art. That is, this signifies that, according to the first CS optical pulse train generation method, power consumption is lower than the conventional CS optical pulse train generation method that uses a LN optical intensity modulator.

Figure 10A:
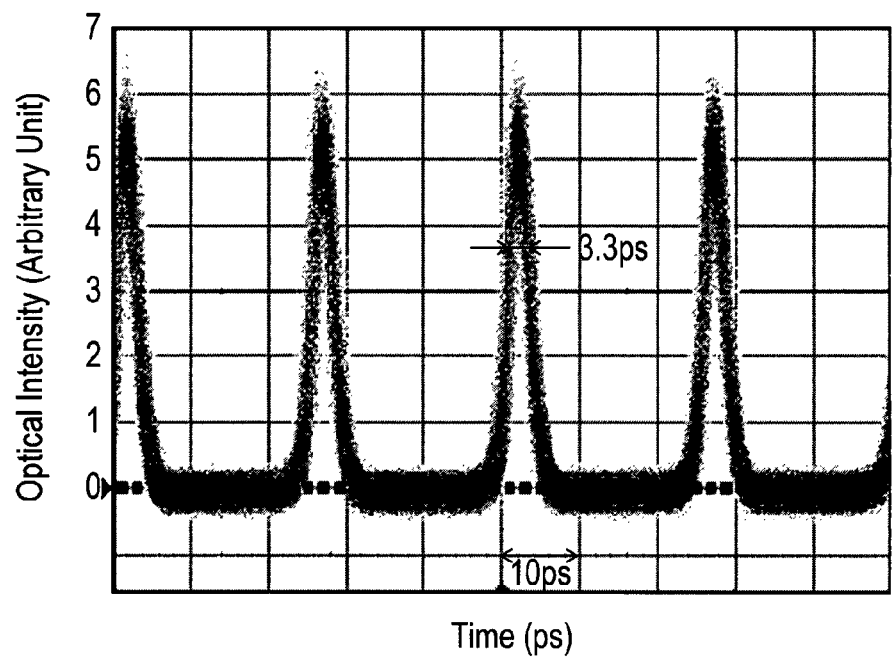
FIG. 10 is diagrams showing a CS optical pulse train with an optical pulse width of 3.3 ps outputted from a mode-locked semiconductor laser diode of the first embodiment, FIG. 10A being a diagram showing a time waveform, and FIG. 10B being a diagram showing a wavelength spectrum.
Figure 10B:
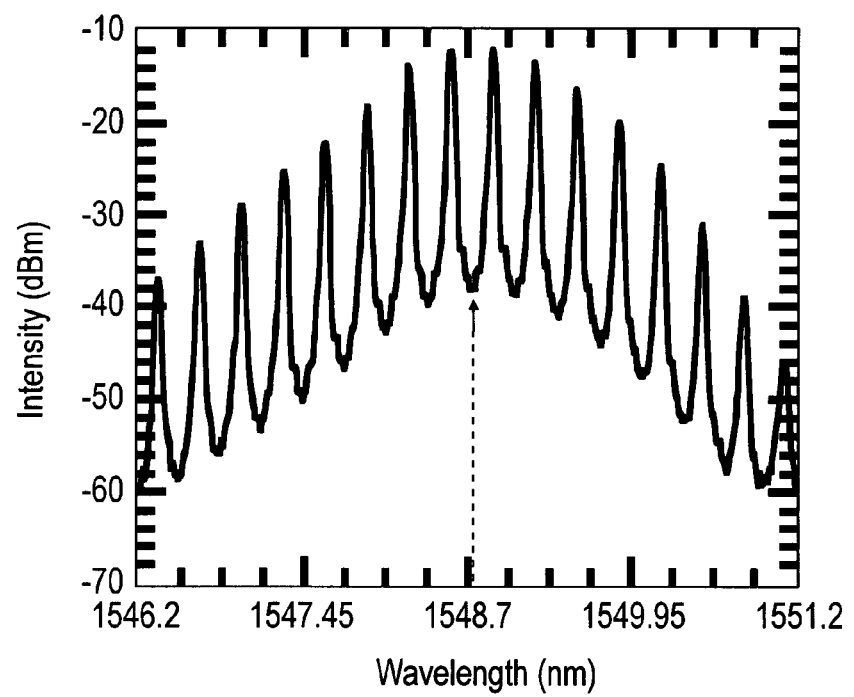

The characteristics of a time waveform and wavelength spectrum waveform of a CS optical pulse train outputted by a mode-locked distributed Bragg reflector semiconductor laser of the first embodiment will be explained by referring to FIG. 10A and FIG. 10B. FIG. 10A and FIG. 10B are diagrams showing a CS optical pulse train with an optical pulse width of 3.3 ps, FIG. 10A being a diagram showing a time waveform, and FIG. 10B being a diagram showing a wavelength spectrum. The horizontal axis of FIG. 10A represents time on a graduated scale in ps units, and the vertical axis represents optical intensity on a graduated scale in arbitrary units. Further, the horizontal axis of FIG. 10B represents wavelength on a graduated scale in nm units, and the vertical axis represents wavelength spectrum intensity on a graduated scale in dBm units.

As shown in FIG. 10B, the wavelength spectrum does not have a central (wavelength location depicted by the up arrow in FIG. 10B) spectrum component, and constitutes a bilaterally symmetrical shape. That is, the intensity of the spectrum at the wavelength location indicated by the up arrow in FIG. 10B is depicted as the local minimum, and the wavelength spectrum constitutes a bilaterally symmetrical shape with this local minimum location in the center. From this, it is clear that a CS optical pulse train having the time waveform shown in FIG. 10A has been generated from the distributed Bragg reflector semiconductor laser.

As explained hereinabove, according to the first CS optical pulse train generation method, it is possible to generate a CS optical pulse train, in which the optical pulse width is variable, by using a multi-electrode-type distributed Bragg reflector semiconductor laser. Further, the modulation voltage deemed necessary for generating a CS optical pulse train, and the modulation voltage deemed necessary for modulating the transmittance of an electro-absorption optical modulation region can also be lower than in the conventional method. That is, according to the first CS optical pulse train generation method, the apparatus itself can be made compact, and can be driven at low power consumption, and, moreover, it is also possible to adjust the width of the optical pulses constituting a generated CS optical pulse train.

Second Embodiment

Figure 11:
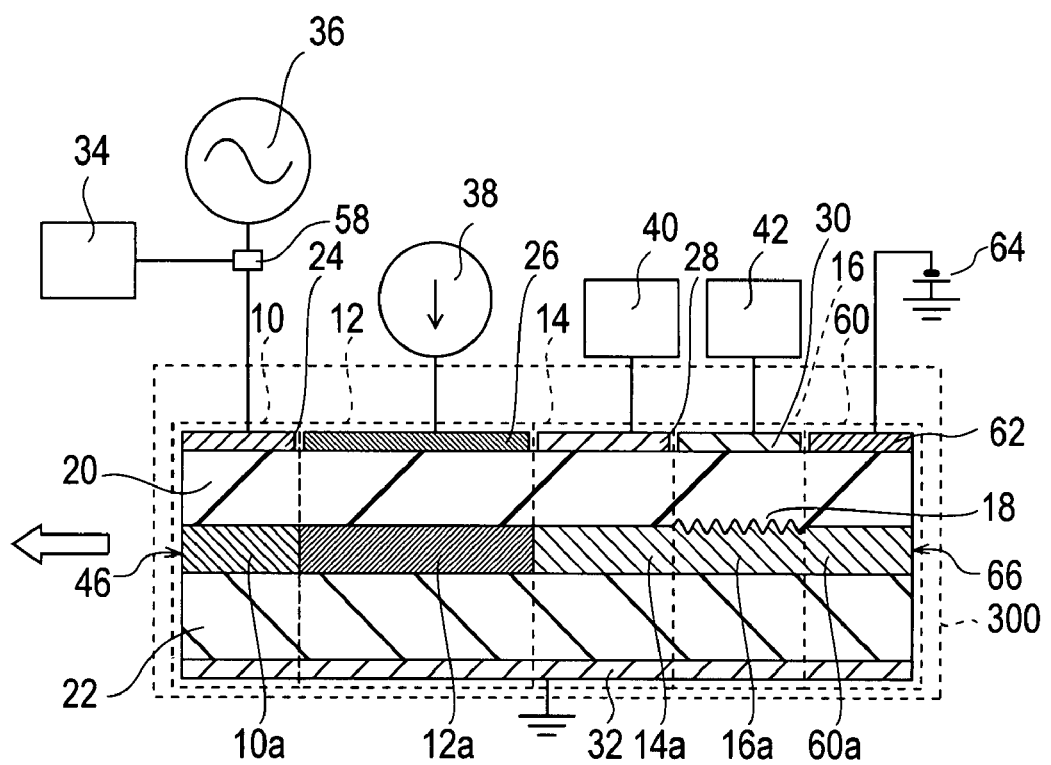
FIG. 11 is a simplified block diagram of a mode-locked semiconductor laser diode of a second embodiment.

The constitution of a distributed Bragg reflector semiconductor laser 300, which is a second distributed Bragg reflector semiconductor laser for realizing a second CS optical pulse train generation method, will be explained by referring to FIG. 11. The mode-locked operation principle of this distributed Bragg reflector semiconductor laser 300 will also be explained. FIG. 11 is a simplified enlarged cross-sectional view of the distributed Bragg reflector semiconductor laser 300 for realizing a second CS optical pulse train generation method.

The distributed Bragg reflector semiconductor laser 300 differs from distributed Bragg reflector semiconductor lasers 100 and 200 in that an optical absorption coefficient adjustment region 60 is also integrated into the cavity facet side of the distributed Bragg reflector region 16. The constitution of the parts other than this is the same as that of distributed Bragg reflector semiconductor lasers 100 and 200 shown in FIG. 1A and FIG. 1B, and as such, a duplicative explanation will be omitted.

The two cavity facets constituting the cavity of the distributed Bragg reflector semiconductor laser 300 are constituted by a cavity facet 46 on the optical modulation region side, and a cavity facet 66 on the optical absorption coefficient adjustment region side. The cavity facet 66 on the optical absorption coefficient adjustment region 60 side differs from that in the distributed Bragg reflector semiconductor lasers 100 and 200 of the first embodiment in that it can utilize a cleavage plane that is not covered with a nonreflective coating.

A CS optical pulse train generated by the distributed Bragg reflector semiconductor laser 300 is outputted from the cavity facet 46 of the optical modulation region side. Reverse bias voltage from a constant voltage source 64 is applied to the optical absorption coefficient adjustment region 60 via a p-side electrode 62 and a n-side common electrode 32.

A condition for implementing the first CS optical pulse train generation method of the present invention is that the reflectivity and wavelength dependence of the penetration depth of the distributed Bragg reflector region 16 of the distributed Bragg reflector semiconductor laser comprise characteristics that are symmetrical to the Bragg wavelength. In order that this condition be strictly met, the facet reflectivity of the cavity facet 44 on the distributed Bragg reflector region 16 shown in FIG. 1 must be 0.

Generally speaking, the reflectivity of the cleavage plane constituting the cavity facet of a distributed Bragg reflector semiconductor laser is not 0, and comprises a finite size. Sufficiently reducing reflectivity is not easy even when a coating is applied to the cleavage plane. When the reflectivity of the cavity facet of a distributed Bragg reflector semiconductor laser is not 0, the reflectivity and wavelength dependence of the penetration depth thereof, as explained hereinbelow, are greatly affected by the initial phase of the formed diffraction grating, and the facet reflectivity.

Figure 12:
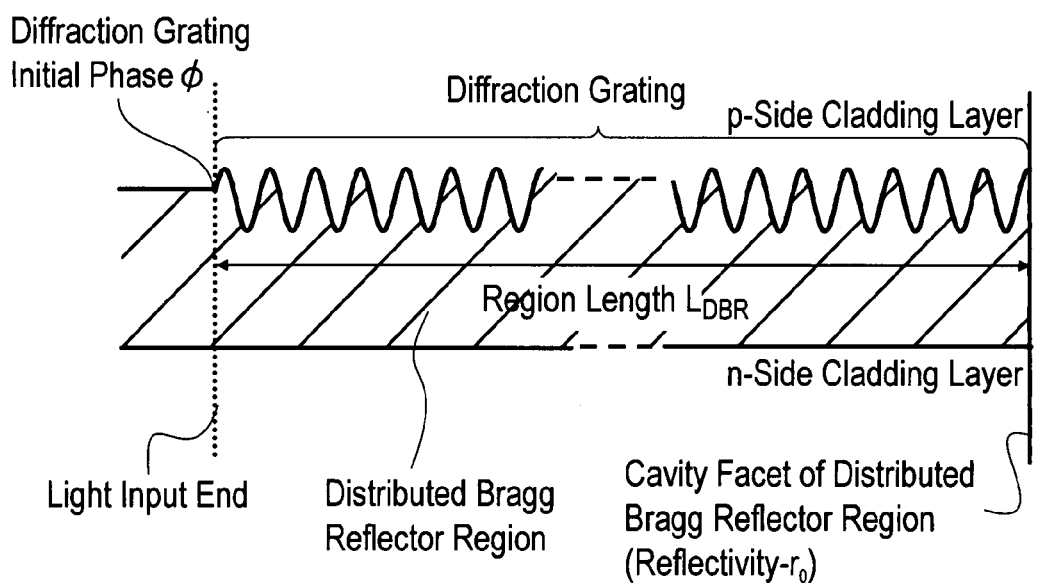
FIG. 12 is a diagram provided to illustrate the initial phase of a diffraction grating.

The initial phase of a diffraction grating will be explained by referring to FIG. 12. FIG. 12 is a diagram provided to illustrate the initial phase of a diffraction grating, and shows an enlarged view of the distributed Bragg reflector region 16. Initial phase of the diffraction grating refers to the phase of the diffraction grating at the light input end of the distributed Bragg reflector region 16 (left end of the distributed Bragg reflector region 16) as shown in FIG. 12.

Using an InP laser diode with an oscillation wavelength in the 1.55 μm band is used as an example, the diffraction grating cycle is 240 nm. Therefore, fabrication technology capable of processing with good repeatability dimensions smaller than several tens of nm is needed to accurately set the initial phase of a diffraction grating, and this is extremely difficult at present. Therefore, fabricating a distributed Bragg reflector semiconductor laser in which the diffraction grating initial phase has been set in accordance with a design value is not possible at present. That is, the initial phase of the diffraction grating cannot be set as a design parameter when fabricating a distributed Bragg reflector semiconductor laser.

Meanwhile, the reflection characteristic of a distributed Bragg reflector with a facet reflectivity that is not 0 is determined by the interference of the Bragg reflection according to the diffraction grating and the Fresnel reflection according to the facet of the distributed Bragg reflector region 16. The characteristics of the phase of the reflected light by Bragg reflection is a function of the initial phase of the diffraction grating. Thus, the synthesized reflectivity of both the Bragg reflection and the Fresnel reflection, which establishes the interference between the Bragg reflected light and the Fresnel reflected light, is strongly dependent on both the initial phase of the diffraction grating and the facet reflectivity.

The amplitude reflectivity $r_{DBR}$ of a distributed Bragg reflector having finite facet reflectivity is given by the equations (9) through (12) below (For example, refer to "Semiconductor Lasers and Photonic Integrated Circuits" edited by Yasuharu Suematsu, first edition, Ohmsha, Ltd.)

$$r_{DBR} = \frac{\gamma r_0 e^{-i(2\beta_0 L_{DBR}+\phi)}\cosh\gamma L_{DBR} - \{(\frac{\alpha}{2}+i\delta)r_0 e^{-i(2\beta_0 L_{DBR}+\phi)} + i\kappa\}\sinh\gamma L_{DBR}}{\gamma\cosh\gamma L_{DBR} + \{(\frac{\alpha}{2}+i\delta)r_0 e^{-i(2\beta_0 L_{DBR}+\phi)}\}\sinh\gamma L_{DBR}} e^{i\phi} \quad (9)$$

$$\beta_0 = \frac{2\pi n_{DBR}}{\lambda_{Bragg}} \quad (10)$$

$$\delta = 2\pi n_{DBR}\left(\frac{1}{\lambda} - \frac{1}{\lambda_{Bragg}}\right) \quad (11)$$

$$\gamma^2 = \left(\frac{\alpha}{2} + i\delta\right)^2 + \kappa^2 \quad (12)$$

Here, $n_{DBR}$ and $L_{DBR}$ are the effective index and region length of the distributed Bragg reflector region, respectively, $\lambda_B$ is the Bragg wavelength, a is the absorption coefficient, $\kappa$ is the coupling coefficient of the diffraction grating, $\Phi$ is the initial phase of the diffraction grating, and $r_0$ is the facet reflectivity (amplitude reflectivity).

Incidentally, $r_{DBR}$ when facet reflectivity is 0 is given by equation (13) below.

$$r_{DBR}(r_0 = 0) = \frac{-i\kappa\tanh\gamma L_{DBR}}{\gamma + (\frac{\alpha}{2}+i\delta)\tanh\gamma L_{DBR}} e^{i\phi} \quad (13)$$

The energy reflectivity $|r_{DBR}|^2$ of a distributed Bragg reflector calculated using the above-mentioned equations (9) through (13) will be explained by referring to FIG. 13A through FIG. 13E. FIG. 13A through FIG. 13E are diagrams showing the energy reflectivity of a distributed Bragg reflector, FIG. 13A through FIG. 13E respectively showing situations in which changes are made to the reflectivity $R_0$ of the cleavage plane and the energy reflectivity of the cleavage facet using the initial phase $\Phi$ of the diffraction grating as a parameter. In the respective diagrams, the horizontal axis represents the wavelength on a graduated scale in nm units, and the vertical axis represents the energy reflectivity in arbitrary units.

Here, the energy reflectivity shown in FIG. 13A through FIG. 13E is the result of calculations using $n_{DBR}$=3.2, $L_{DBR}$=50 μm, $\lambda_B$=1550 nm, $\alpha$=10 cm$^{-1}$, and $\kappa$=100 cm$^{-1}$. This calculated condition is a characteristic typical of a distributed Bragg reflector semiconductor laser.

The result shown in FIG. 13A is the result of calculations when the energy reflectivity $R_0$ ($|r_0|^2$) of a cleavage facet is 0, and the results shown in FIG. 13B through FIG. 13E are the results of calculations when the initial phase $\Phi$ of the diffraction grating is respectively changed from 0 to 1.5 π in increments of 0.5 π in a case in which the energy reflectivity $R_0$ (=$|r_0|^2$) of a cleavage facet is 0.274 ($|r_0|^2$=0.274).

When the energy reflectivity of the cleavage facet is 0, the energy reflectivity of the distributed Bragg reflector $|r_{DBR}|^2$ does not change even if the initial phase $\Phi$ of the diffraction grating changes. Similarly, there is no change in the penetration depth $L_{eff}$ either. The energy reflectivity of the distributed Bragg reflector $|r_{DBR}|^2$ and the wavelength dependence of the penetration depth $L_{eff}$ constitute characteristics that are symmetrical to the Bragg wavelength as explained by referring to FIG. 6, and consequently, it is possible to realize the second CS optical pulse train generation method in accordance with a distributed Bragg reflector semiconductor laser that satisfies this condition.

By contrast, since the energy reflectivity of the cleavage facet $R_0$ is not 0, the energy reflectivity of the distributed Bragg reflector $|r_{DBR}|^2$ changes in dependence on the initial phase $\Phi$ of the diffraction grating. In general, the profiles (wavelength dependencies) of the reflectivity of the distributed Bragg reflector region and the penetration depth are unsymmetrical, and the wavelength at which the reflectivity of the distributed Bragg reflector region is the largest, and the penetration depth at this wavelength change greatly. The wavelength dependency of the penetration depth is also unsymmetrical, the same as the wavelength dependency of the reflectivity of the distributed Bragg reflector region.

That is, the first CS optical pulse train generation method is not realized unless the energy reflectivity of the cleavage facet $R_0$ is sufficiently small. Therefore, to reduce the reflectivity of the cleavage facet (the cavity facet 44 on the distributed Bragg reflector region 16 side) of the distributed Bragg reflector semiconductor laser in order to realize the first CS optical pulse train generation method, it is necessary to use a low reflection coating. In this case, the problem from a practical standpoint is being able to determine just how much to reduce the energy reflectivity of the cleavage facet $R_0$ in order to make this energy reflectivity small enough. That is, the technical problem is whether it is possible to obtain reflection characteristics that are symmetrical to the Bragg wavelength as shown in FIG. 6 and FIG. 13A by sufficiently suppressing the affect of the Fresnel reflection at the cavity facet 44 of the distributed Bragg reflector region 16 side without depending on the uncontrollable parameter $\Phi$ (initial phase of the diffraction grating).

The initial phase $\Phi$ dependence of the maximum reflectivity from the distributed Bragg reflector region, the amount of a peak wavelength shift, and penetration depth will be explained by referring to FIG. 14A through FIG. 14D. FIG. 14A through FIG. 14D are diagrams showing the initial phase $\Phi$ dependence of the maximum reflectivity from the distributed Bragg reflector region, the amount of peak wavelength shift, and penetration depth when cleavage plane reflectivity $R_0$ is changed as a parameter in the first embodiment.

Figure 14A:
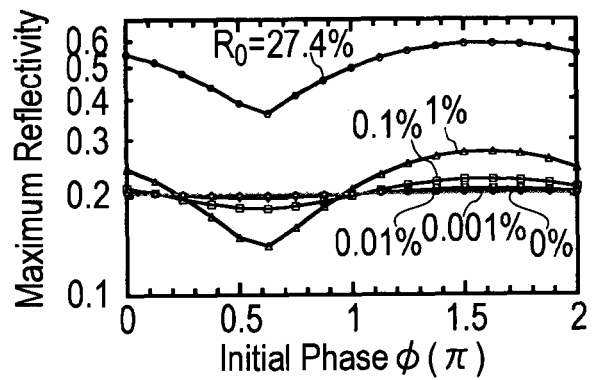
FIG. 14 is diagrams showing the initial phase $\Phi$ dependence of the maximum reflectivity from the distributed Bragg reflector region, the amount of peak wavelength shift, and penetration depth when cleavage plane reflectivity $R_0$ is changed as parameters in the first embodiment, FIG. 14A showing the maximum reflectivity from the distributed Bragg reflector region, FIG. 14B showing amounts of peak wavelength shifts, FIG. 14C showing respective penetration depths when the length of the distributed Bragg reflector region is 50 μm, and FIG. 14D showing the amount of peak wavelength shift when the distributed Bragg reflector region is 50 μm.
Figure 14B:
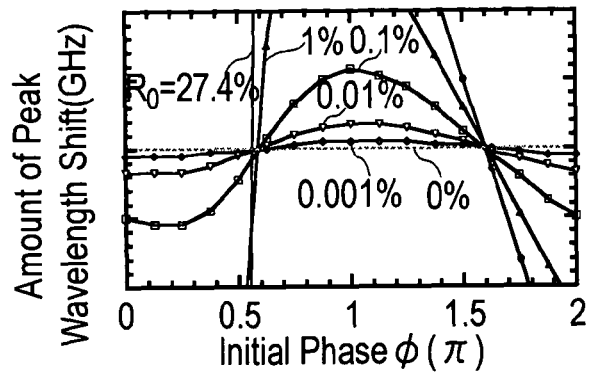
Figure 14C:
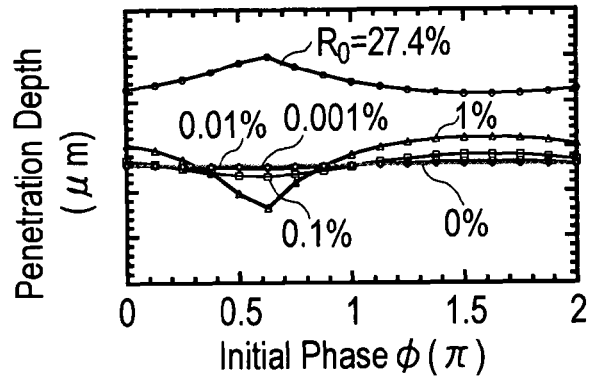
Figure 14D:
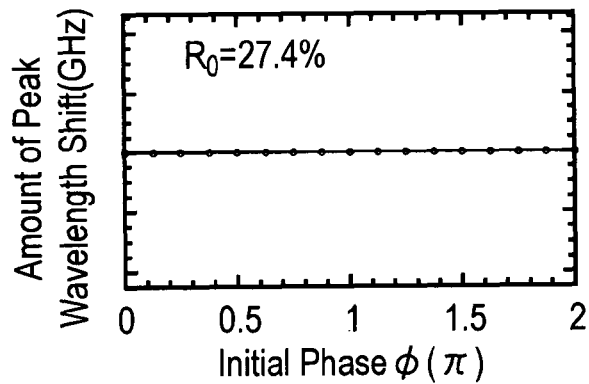

FIG. 14A shows the maximum reflectivity from the distributed Bragg reflector region, FIG. 14B shows amounts of peak wavelength shifts, FIG. 14C shows respective penetration depths when the length of the distributed Bragg reflector region is 50 μm, and FIG. 14D shows the amount of peak wavelength shift when the distributed Bragg reflector region is 50 μm. In each of the respective diagrams, the horizontal axis represents the initial phase of the diffraction grating $\Phi$. Further, the vertical axis of FIG. 14A represents maximum reflectivity, the vertical axes of FIG. 14B and FIG. 14D represent amount of peak wavelength shift on a graduated scale in GHz units, and the vertical axis of FIG. 14C represents penetration depth on a graduated scale in μm units.

The amounts of peak wavelength shifts in FIG. 14B are shown as differences in frequency ($\Delta f_{peak}$). That is, the differences in frequency ($\Delta f_{peak}$) are given by equation (14) below expressing peak wavelength as $\lambda_{peak}$.

$$\Delta f_{peak} = c\left(\frac{1}{\lambda_{peak}} - \frac{1}{\lambda_{Bragg}}\right) \tag{14}$$

Here, c is the speed of light in a vacuum.

As shown in FIG. 14A through FIG. 14C, in order to realize reflection characteristics, which are approximately consistent with reflection characteristics (indicated by the dotted line in the figures as being 0%) from a distributed Bragg reflector region when the energy reflectivity of the cavity facet 44 of the distributed Bragg reflector region 16 side is 0, an $R_0$ of 0.1% is inadequate, and the $R_0$ must be reduced to 0.001% at the most. Advanced technology is required to realize low reflectivity like this using a low-reflective coating. That is, when generating a CS optical pulse train using a distributed Bragg reflector semiconductor laser comprising a facet of the distributed Bragg reflector shown in FIG. 1A and FIG. 1B as the cavity facet of the one side, a problem such as the following can be expected to occur.

The reflection characteristics of the distributed Bragg reflector region change significantly in accordance with the initial phase of the diffraction grating ($\Phi$) and the reflected light generated by the fact that the energy reflectivity $R_0$ of the cavity facet 44 of the distributed Bragg reflector region 16 side is not 0. As a result, the pulse characteristics of a generated CS optical pulse train fluctuate considerably in accordance with the distributed Bragg reflector semiconductor laser element that is used, and it becomes difficult to realize the CS optical pulse train generation method.

One means for suppressing the affect of reflected light generated at the cleavage plane is to make a structure in which the length of the distributed Bragg reflector region $L_{DBR}$ is sufficiently long, and light inputted to the distributed Bragg reflector region is reflected as a Bragg reflection prior to reaching the facet of the distributed Bragg reflector. FIG. 14D shows the results of calculating the amount of peak wavelength shift when the length $L_{DBR}$ of the distributed Bragg reflector region is lengthened to 50 μm. Here it is calculated as $R_0$=27.4%. A state is maintained in which, despite the fact that the facet of the one side of the distributed Bragg reflector is the cleavage plane, and reflectivity has not been reduced, the amount of peak wavelength shift is approximately 0 with practically no dependence on the initial phase of the diffraction grating, and the wavelength, which provides the maximum reflectivity, is approximately consistent with the Bragg wavelength. That is, in this case, reflection characteristics, which are approximately consistent with the reflection characteristics when the facet reflectivity of the cavity facet 44 of the distributed Bragg reflector region 16 side is 0, are realized.

However, as is well known, when the region length $L_{DBR}$ of the distributed Bragg reflector is lengthened, the bandwidth of the reflectivity profile (the wavelength bandwidth that causes reflection) narrows. This restricts the number of longitudinal modes that are capable of lasing. The result is that the spectrum width at mode-locked operation is restricted. Since the spectrum width and pulse width are interrelated in a Fourier transformation, if lasable longitudinal modes are restricted, the optical pulse width achievable during mode-locked operation will be restricted to the minimum value. Therefore, the result is disadvantageous in that the variable width of the optical pulse width is restricted.

Accordingly, the distributed Bragg reflector semiconductor laser used in the second CS optical pulse train generation method is a distributed Bragg reflector semiconductor laser which is capable of mode-locked operation independent of the reflection generated at the cleavage plane and the initial phase of the diffraction grating, without lengthening the length of the distributed Bragg reflector region. The distributed Bragg reflector semiconductor laser 300 used in the second CS optical pulse train generation method connects to the cavity facet 44 of the distributed Bragg reflector region 16 side in the distributed Bragg reflector semiconductor lasers 100 and 200, and is also equipped with an optical absorption coefficient adjustment region 60. Further, the cavity facet 66 of the optical absorption coefficient adjustment region 60 side does not require the application of a low reflective coating.

Reverse bias voltage from a constant voltage source 64 is applied to the optical absorption coefficient adjustment region 60 by way of the p-side electrode 62 and the n-side common electrode 32. Applying reverse bias voltage shifts the bandgap wavelength of the optical absorption coefficient adjustment region 60 to the longer wavelength side, resulting in an increase in the absorption coefficient of the optical absorption coefficient adjustment region 60. Light, which has passed through the distributed Bragg reflector region 16 from the left end to the right end, passes through the optical absorption coefficient adjustment region 60, is reflected by the cavity facet 66 of optical absorption coefficient adjustment region 60 side, and thereafter, subsequent to once again passing through the optical absorption coefficient adjustment region 60, enters the distributed Bragg reflector region 16 once again. The intensity of the light, which re-enters the distributed Bragg reflector region 16, is determined by the product of the amount of light attenuation during the back and forth passage through the optical absorption coefficient adjustment region 60, and the facet reflectivity of the cavity facet 66 of the optical absorption coefficient adjustment region 60 side.

Therefore, if the amount of attenuation of the light as it passes through the optical absorption coefficient adjustment region 60 is great, that is, setting the value of the optical absorption coefficient of the optical absorption coefficient adjustment region 60 to a magnitude sufficient to prevent the light reflected at the cavity facet 66 of the optical absorption coefficient adjustment region 60 from reaching the distributed Bragg reflector region 16 (Step D2) can adequately reduce the intensity of the light re-entering the distributed Bragg reflector region 16. This is equivalent to when the facet reflectivity of the cavity facet 44 of the distributed Bragg reflector region 16 side is adequately lowered in the first embodiment. Therefore, if the amount of attenuation of the light as it passes through the optical absorption coefficient adjustment region 60 is large enough, even if the facet reflectivity of the cavity facet 66 of the optical absorption coefficient adjustment region 60 is rather large, it is possible to realize reflectivity characteristics, which are extremely consistent with the reflectivity characteristics obtained when the facet reflectivity of the cavity facet 44 of the distributed Bragg reflector region 16 side was made 0 in the first embodiment. As a result, a CS optical pulse train can be generated from the distributed Bragg reflector semiconductor laser 300 even if the facet reflectivity of the cavity facet 66 is rather large.

Figure 15A:
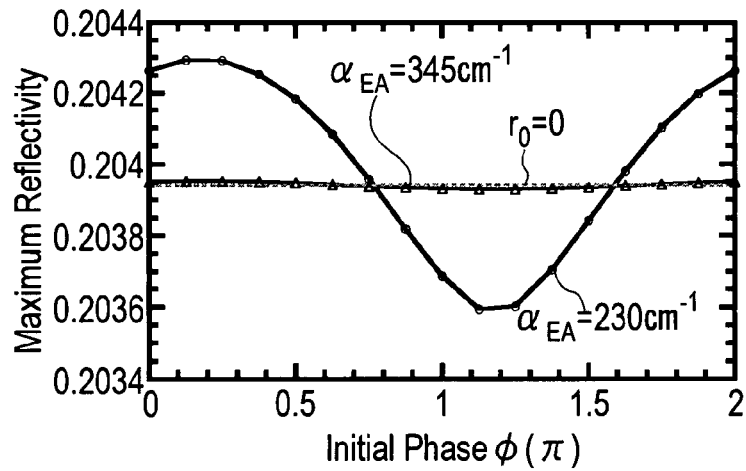
FIG. 15 is diagrams showing the maximum reflectivity from the distributed Bragg reflector region, the amount of peak wavelength shift, and the initial phase $\Phi$ dependence of penetration depth when the absorption coefficient αEA of the optical absorption coefficient adjustment region is changed as a parameter in the second embodiment, FIG. 15A showing the maximum reflectivity from the distributed Bragg reflector region, FIG. 15B showing the amount of peak wavelength shift, FIG. 15C showing respective penetration depths.
Figure 15B:
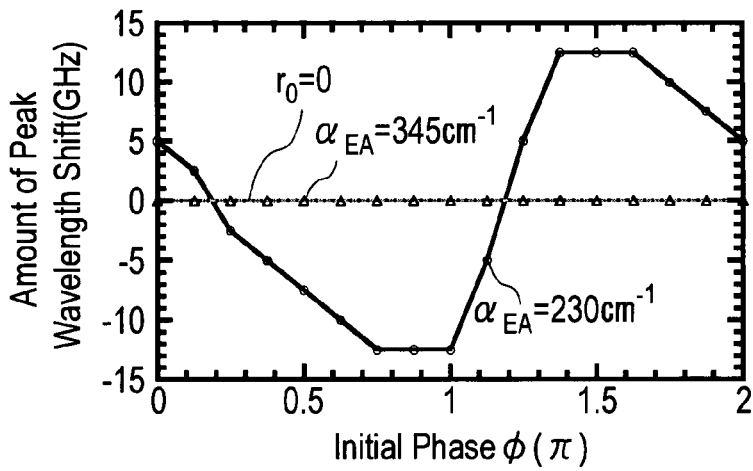
Figure 15C:
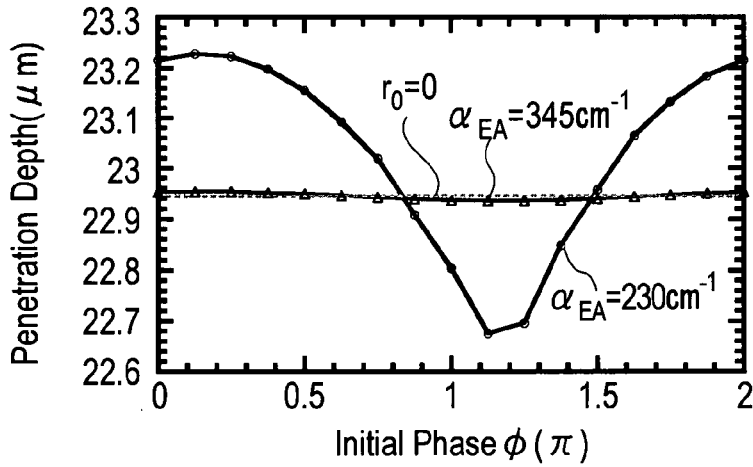

The maximum reflectivity, amount of peak wavelength shift, and penetration depth dependence of reflected light from the distributed Bragg reflector region relative to diffraction grating initial phase dependence in the distributed Bragg reflector semiconductor laser comprising an optical absorption coefficient adjustment region shown in FIG. 11 will be explained by referring to FIG. 15A through FIG. 15C. FIG. 15A through FIG. 15C show the maximum reflectivity from the distributed Bragg reflector region, the amount of peak wavelength shift, and the initial phase $\Phi$ dependence of penetration depth when the absorption coefficient αEA of the optical absorption coefficient adjustment region is used as a parameter in the second embodiment, FIG. 15A showing the maximum reflectivity from the distributed Bragg reflector region, FIG. 15B showing the amount of peak wavelength shift, FIG. 15B showing penetration depth, respectively. In FIG. 15A through FIG. 15C, the horizontal axes represent the initial phase Φ of the diffraction grating. Further, the vertical axis of FIG. 15A represents maximum reflectivity, the vertical axis of FIG. 15B represents amount of peak wavelength shift in GHz units, and the vertical axis of FIG. 15C represents penetration depth in μm units.

The calculation results shown in FIG. 15A through FIG. 15B were obtained by presuming the same parameters as in FIG. 13A through E and FIG. 14A through (D). That is, these parameters were calculated as $n_{DBR}=3.2$, $L_{DBR}=50$ μm, $λB=1550$ nm, $α=10$ cm$^{-1}$, and $κ=100$ cm$^{-1}$. Further, the facet reflectivity of the cavity facet 66 of the optical absorption coefficient adjustment region 60 side is treated as 27.4% when the cavity facet 66 is the cleavage plane. Further, the optical absorption coefficients (αEA) of the optical absorption coefficient adjustment region 60 are respectively treated as 230 cm$^{-1}$ and 345 cm$^{-1}$, and the region length of the optical absorption coefficient adjustment region 60 is treated as 300 μm.

If the absorption coefficients αEA of 230 cm$^{-1}$ and 345 cm$^{-1}$ are converted to light attenuation amounts at lengths of 100 μm, they respectively correspond to −10 dB and −15 dB, which are values fully capable of being realized if there is an ordinary electro-absorption optical modulator comprising the same function as the function of the optical absorption coefficient adjustment region 60. Further, for the sake of comparison, calculation results for the distributed Bragg reflector semiconductor laser of the first embodiment, which does not comprise an optical absorption coefficient adjustment region 60, and for which the value of the facet reflectivity $R_0$ of the cavity facet 44 is 0, are indicated by the dotted line depicted at $r_0=0$ in the figures.

As shown in FIG. 15A through FIG. 15C, when the absorption coefficient αEA of the optical absorption coefficient adjustment region 60 is a large 345 cm$^{-1}$, it is clear that the maximum reflectivity, amount of peak wavelength shift and penetration depth constitute fixed amounts, which are not substantially dependent on the diffraction grating initial phase. Further, these amounts are approximately consistent with the characteristics of the distributed Bragg reflector of the ideal first embodiment distributed Bragg reflector semiconductor laser, for which the facet reflectivity $R_0$ value is 0, indicated by the dotted line depicted at $r_0=0$. It is clear that the reflection characteristics of the distributed Bragg reflector region obtained at this time are the preferred reflection characteristics deemed necessary for generating a CS optical pulse train in which the wavelength dependence of both reflectivity and penetration depth are symmetrical to the Bragg wavelength.

According to the distributed Bragg reflector semiconductor laser 300 comprising the optical absorption coefficient adjustment region 60 shown in FIG. 11, it is possible to realize a distributed Bragg reflector comprising reflection characteristics, which are symmetrical to the Bragg wavelength as shown in FIG. 6, without dependence on the initial phase of the diffraction grating in the distributed Bragg reflector region, or on the facet reflectivity of the cavity facet. As a result, it is possible to suppress the initial phase of the diffraction grating, and fluctuations in the reflection characteristics of the distributed Bragg reflector, which are caused by reflected light from the cavity facet 66, and to suppress the fluctuation of characteristics between elements. Further, the generation of a CS optical pulse train can be realized more reliably by the distributed Bragg reflector semiconductor laser 300 comprising the optical absorption coefficient adjustment region 60.

Third Embodiment

Figure 16:
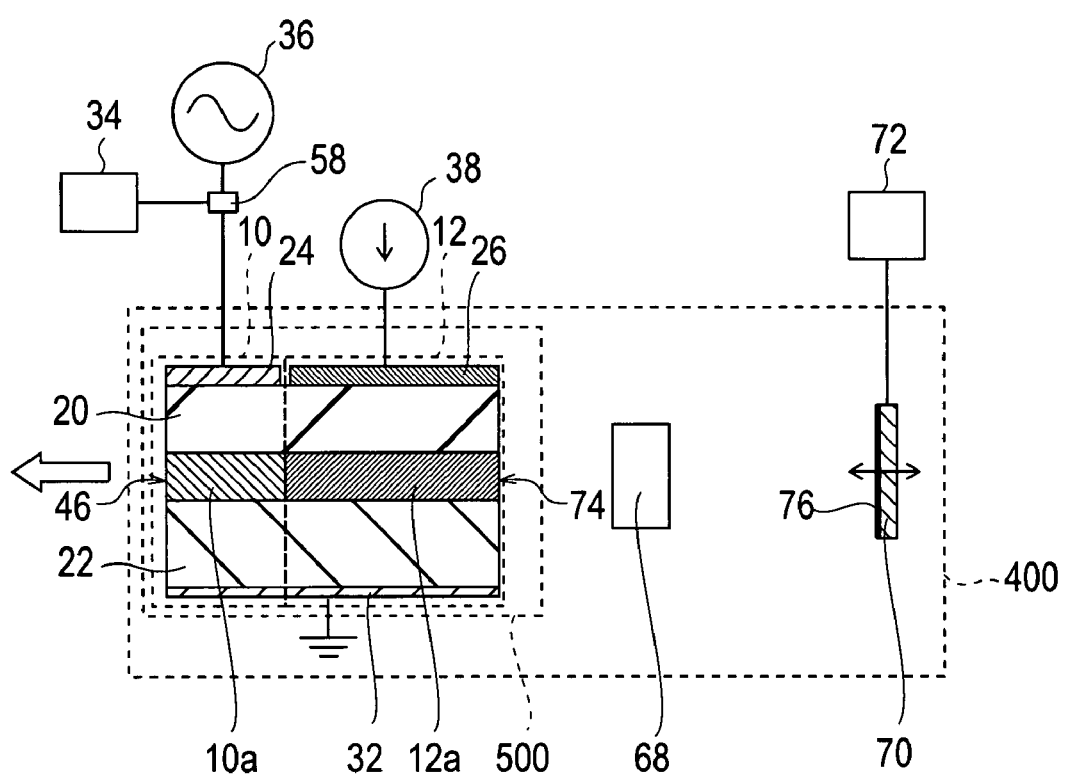
FIG. 16 is a simplified block diagram of a mode-locked semiconductor laser diode of a third embodiment.

The constitution of a Fabry-Perot external-cavity type semiconductor laser 400 used in a third CS optical pulse train generation method will be explained by referring to FIG. 16. FIG. 16 is a simplified enlarged cross-sectional view for illustrating the constitution of a Fabry-Perot external-cavity type semiconductor laser 400 of a third embodiment. The Fabry-Perot external-cavity type semiconductor laser 400 is constituted comprising a wavelength filter 68, which converts a center transmission wavelength to a frequency $f_0$, and a multi-electrode semiconductor laser diode element 500, which is constituted by linearly arranging an optical modulation region 10 comprising a function for modulating optical intensity, and a gain region 12, in which population inversion is achieved. This wavelength filter 68 and this multi-electrode semiconductor laser diode element 500 are arranged linearly and housed in an external cavity.

More specifically, the Fabry-Perot external-cavity type semiconductor laser 400 comprises a constitution in which a multi-electrode semiconductor laser diode element 500, which comprises an optical modulation region 10 and a gain region 12, and in which the facet 74 of the gain region side is covered with a low reflective coating, a wavelength filter 68, and a movable mirror 70 are lined up in a straight line. The multi-electrode semiconductor laser diode element 500, wavelength filter 68, and movable mirror 70 are optically coupled using a lens or the like. The optical cavity is formed by one more facet 46 in the multi-electrode semiconductor laser diode element 500, which facet is not covered by a low reflective coating, and the reflection surface 76 of the movable mirror 70. Population inversion is achieved and lasing is generated by injecting current from a constant current source 38 into the gain region 12 by way of a p-side electrode 26 and a n-side common electrode 32 (Step A3).

Further, the movable mirror 70 comprises a function for changing the cavity length of the Fabry-Perot external-cavity type semiconductor laser 400 by using a movable mirror control device 72 to change the position thereof (Step B3). Further, the optical modulation region 10 generates the optical modulation required to express mode locking by virtue of a constant current or constant voltage from a constant current source or a constant voltage source 34, and an alternating current voltage of frequency $f_{rep}$ from an alternating current power source 36 being applied between a p-side electrode 24 and the n-side common electrode 32 (Step C3).

Operating this semiconductor laser 400 through the above-described respective steps of step A3 through step C3 puts this Fabry-Perot external-cavity type semiconductor laser under mode-locked operation, and outputs a CS optical pulse train with a repetitive frequency of $f_{rep}$. In a Fabry-Perot external-cavity type semiconductor laser used as the Fabry-Perot external-cavity type semiconductor laser 400 shown in FIG. 16, the gain region 12 of the multi-electrode semiconductor laser diode element 500 undergoes current injection from a constant current source 38 (Step A3).

Changing the length of the cavity by using the movable mirror control device 72 to move the movable mirror 70 makes adjustments such that the location of a longitudinal mode of the Fabry-Perot external-cavity type semiconductor laser 400 is arranged symmetrically to the center wavelength of the transmission characteristic of the wavelength filter 68 (Step B3). Then, bias voltage from a constant voltage source 36 and modulation voltage from an alternating current power source 34 are applied to the optical modulation region 10 (Step C3).

When the frequency ($f_{rep}$) of the modulation voltage from the alternating current power source 36 approximates a natural number multiple of the cavity roundtrip frequency given as the inverse of the time required for light to circle around the optical cavity of the Fabry-Perot external-cavity type semiconductor laser 400 one time, mode-locked operation is generated, and a mode-locked optical pulse train with a repetitive frequency of $f_{rep}$ is generated from the Fabry-Perot external-cavity type semiconductor laser 400. Approximates means the difference between the natural number multiple of the cavity roundtrip frequency and the repetitive frequency $f_{rep}$ of the optical pulse train is small enough for frequency pulling to occur. By so doing, an optical pulse train outputted from the Fabry-Perot external-cavity type semiconductor laser 400 becomes a CS optical pulse train.

According to the third CS optical pulse train generation method, the following effect is achieved in addition to the effect achieved via the first and second CS optical pulse train generation methods. That is, since it is easy to increase the amount of change of the cavity length using the movable mirror 70, the cavity roundtrip frequency can be changed on a grand scale. That is, the repetitive frequency $f_{rep}$ of a generated CS optical pulse train can be varied substantially. Further, similarly, since it is easy to significantly change the center wavelength of the transmission characteristic of the wavelength filter 68, significant changes to the center wavelength of the laser oscillating spectrum can easily be carried out. That is, the center wavelength of a generated CS optical pulse train can be varied substantially.

Fourth Embodiment

Figure 17:
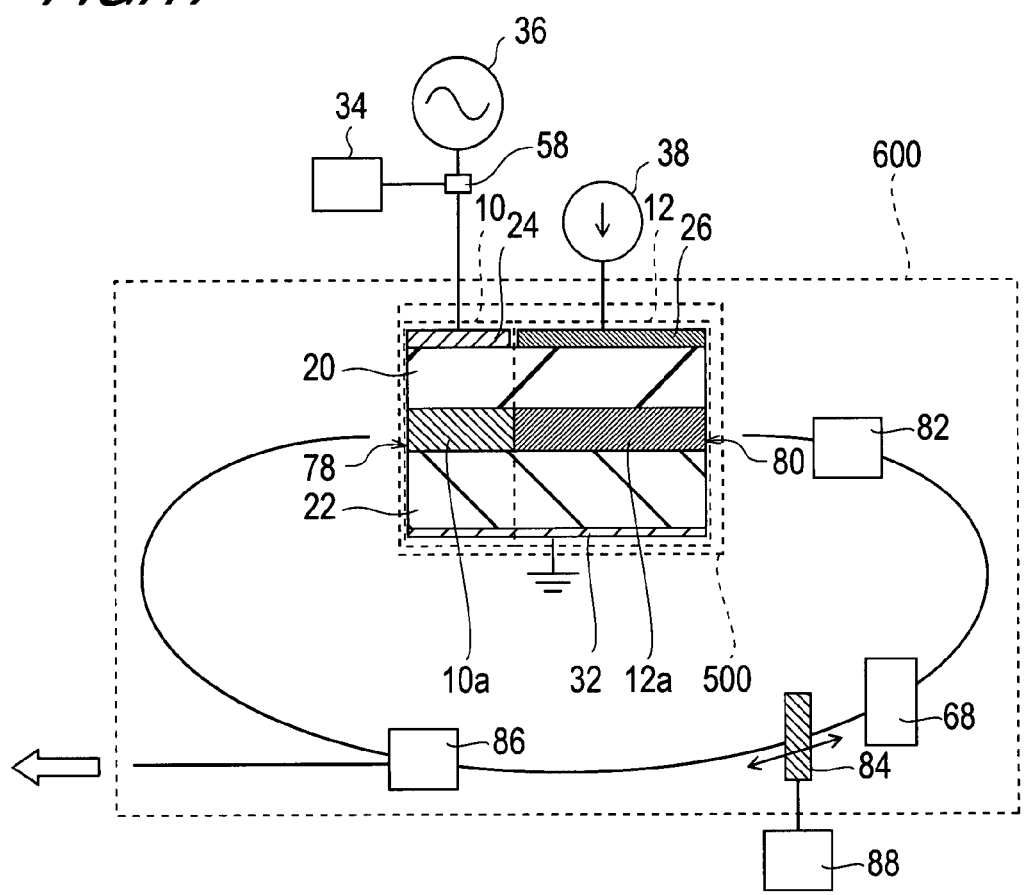
FIG. 17 is a simplified block diagram of a mode-locked semiconductor laser diode of a fourth embodiment.

The constitution of a ring resonator-type semiconductor laser 600 used in a fourth CS optical pulse train generation method will be explained by referring to FIG. 17. FIG. 17 is a simplified enlarged cross-sectional view for illustrating the constitution of a ring resonator-type semiconductor laser 600 of a fourth embodiment. The ring resonator-type semiconductor laser is constituted comprising a wavelength filter 68, which converts a center transmission wavelength to a frequency $f_0$, a multi-electrode semiconductor laser diode 500, which is constituted by linearly arranging an optical modulation region 10 comprising a function for modulating optical intensity, and a gain region 12, in which population inversion is achieved, and a variable optical delay device 84 for changing an optical length. This wavelength filter 68, multi-electrode semiconductor laser diode 500, and variable optical delay device 84 are housed in a ring resonator.

Applying alternating current voltage equivalent to frequency $f_{rep}$ to the optical modulation region 10 makes it possible to modulate the transmittance thereof, and the length of the roundtrip cavity of the ring resonator can be adjusted using the variable optical delay device 84 so as to put this ring resonator-type semiconductor laser under mode-locked operation at an oscillation longitudinal mode given by the oscillation longitudinal mode $f_0 \pm q(f_{rep}/2)$. Putting this ring resonator-type semiconductor laser under mode-locked operation, enables the output of a CS optical pulse train with a repetitive frequency of $f_{rep}$ from the ring resonator-type semiconductor laser.

More specifically, the ring resonator-type semiconductor laser 600 is a constitution in which a multi-electrode semiconductor laser diode element 500, which comprises an optical modulation region 10 and a gain region 12, and in which the facet 80 of the one side is covered with a low reflective coating, a wavelength filter 68, and a variable optical delay device 84 are lined up in a ring shape. The multi-electrode semiconductor laser diode element 500, wavelength filter 68, and variable optical delay device 84 are optically coupled using a lens or the like (omitted from the figure). The optical cavity is formed as a loop-shaped optical path comprising the multi-electrode semiconductor laser diode element 500, wavelength filter 68, and variable optical delay device 84.

Population inversion is achieved and lasing is generated by injecting current from a constant current source 38 into the gain region 12 by way of a p-side electrode 26 and a n-side common electrode 32 (Step A4).

Further, the variable optical delay device 84 comprises a function for changing the length of the loop-shaped cavity of the ring resonator-type semiconductor laser 600 by using a variable optical delay device control device 88 to change the quantity of optical delay (Step B4). The optical modulation region 10 generates the optical modulation required to express mode locking by virtue of a constant current or constant voltage from a constant current source or a constant voltage source 34, and an alternating current voltage of frequency $f_{rep}$ from an alternating current power source 36 being applied between a p-side electrode 24 and the n-side common electrode 32 (Step C4).

Operating this ring resonator-type semiconductor laser through the above-described respective steps of step A4 through step C4 puts this ring resonator-type semiconductor laser under mode-locked operation, and outputs a CS optical pulse train with a repetitive frequency of $f_{rep}$.

In a ring resonator-type semiconductor laser used as the ring resonator-type semiconductor laser 600 shown in FIG. 17, the gain region 12 of the multi-electrode semiconductor laser diode element 500 undergoes current injection from a constant current source 38 (Step A4).

Changing the length of the cavity by using the variable optical delay device control device 88 to control the variable optical delay device 84 adjusts the location of a longitudinal mode of the ring resonator-type semiconductor laser 600 such that it is arranged symmetrically to the center wavelength of the transmission characteristic of the wavelength filter 68 (Step B4). Then, bias voltage from a constant voltage source 34 and modulation voltage from an alternating current power source 36 are applied to the optical modulation region 10 (Step C4).

When the frequency ($f_{rep}$) of the modulation voltage from the alternating current power source 36 approximates a natural number multiple of the cavity roundtrip frequency given as the inverse of the time required for light to circle around the loop-shaped cavity of the ring resonator-type semiconductor laser 600 one time, mode-locked operation is generated, and a mode-locked optical pulse train with a repetitive frequency of $f_{rep}$ is generated from ring resonator-type semiconductor laser 600. Here, approximates refers to the fact that the difference between the natural number multiple of the cavity roundtrip frequency and the repetitive frequency $f_{rep}$ of the optical pulse train is small enough for frequency pulling to occur. By so doing, an optical pulse train outputted from the ring resonator-type semiconductor laser 600 becomes a CS optical pulse train.

According to the fourth CS optical pulse train generation method, the following effect is achieved in addition to the effect obtained by the first and second CS optical pulse train generation methods. That is, since it is easy to increase the amount of change in the overall length of the loop-shaped cavity length using the variable optical delay device 84, the cavity roundtrip frequency can be changed significantly. That is, the repetitive frequency $f_{rep}$ of a generated CS optical pulse train can be varied substantially. Further, similarly, since it is easy to significantly change the center wavelength of the transmission characteristic of the wavelength filter 68, considerable changes to the center wavelength of the laser oscillating spectrum can easily be carried out. That is, the center wavelength of a generated CS optical pulse train can be varied substantially.

In FIG. 17, the ring resonator-type semiconductor laser 600 comprises an optical isolator 82 for regulating the traveling direction of light inside the loop-shaped cavity to a single direction and guaranteeing the stability of laser oscillation operation, and an optical coupler 86 for configuring the ring resonator and carrying out light extraction.

The mode-locked semiconductor laser diodes used in the first through the fourth CS optical pulse train generation methods are not limited to the examples described hereinabove, and can also be realized using a GaAs-based semiconductor material instead of an InP-based semiconductor material. Further, the arrangement of the respective regions on the multi-electrode semiconductor laser diode element, for example, can also be constituted by transposing the arrangement to gain region, phase control region and optical modulation region.

<Active Mode-locked Operation and Passive Mode-locked Operation>

In the first through the fourth embodiments, explanations were given of examples in which the generation of a CS optical pulse train is realized by making an optical modulation region 10 function as an EA modulator, and putting a distributed Bragg reflector semiconductor laser, a Fabry-Perot external cavity-type semiconductor laser, and ring-resonator-type semiconductor laser under active mode-locked operation. By contrast to this, it is possible to realize the first and second CS optical pulse train generation methods using what is called passive mode-locked operation, in which the optical modulation region 10 is made to function as a saturable absorber. In this case, the reverse bias voltage deemed necessary for making the optical modulation region 10 function as a saturable absorber is supplied to the optical modulation region 10 from the constant voltage source 34. Therefore, in this case, an alternating current power source 36 is not necessary.

Even when put under passive mode-locked operation, adjusting the effective indices of both the phase control region and distributed Bragg reflector region such that, of the longitudinal modes of the passive mode-locked semiconductor laser diode, the two longitudinal modes, which are in proximity to the Bragg wavelength $f_0$ of the distributed Bragg reflector region, become $(f_0+(f_{rep}/2))$ and $(f_0-(f_{rep}/2))$, that is, these two longitudinal modes form a symmetrical relationship with the Bragg wavelength on a frequency axis (Step B1), makes an optical pulse train generated by this passive mode-locked semiconductor laser diode a CS optical pulse train with a repetitive frequency of $f_{rep}$.

Further, applying more alternating current voltage to the optical modulation region 10 after making the optical modulation region 10 function as a saturable absorber enables the generation of a CS optical pulse train even under so-called hybrid mode-locked operation, which reduces time jitter.

In order to put a distributed Bragg reflector semiconductor laser, a Fabry-Perot external cavity-type semiconductor laser, and a ring resonator-type semiconductor laser under hybrid mode-locked operation, first, reverse bias voltage from the constant voltage source 34 is applied to the optical modulation region 10 to make the optical modulation region 10 function as a saturable absorber. Thereafter, an alternating current electrical field of frequency $f_{rep}$ is supplied from the alternating current power source in addition to the reverse bias voltage 36.

Subjecting a semiconductor laser diode to hybrid mode-locked operation is advantageous in that the cycle of an outputted CS optical pulse train is made even more stable (time jitter is reduced) more than with passive mode-locked operation in which an alternating current electrical field of frequency $f_{rep}$ is not applied. Another advantage is that mode-locked operation is easy to achieve because frequency pulling occurs even if there is a big difference between the cavity roundtrip frequency and the repetitive frequency $f_{rep}$ of a CS optical pulse train.

What is claimed is:

1. A carrier-suppressed optical pulse train generation method, comprising:
    putting a distributed Bragg reflector semiconductor laser under mode-locked operation at an oscillation longitudinal mode given by $f_0 \pm q(f_{rep}/2)$ to output an optical pulse train with a repetition frequency of $f_{rep}$,
    wherein q is an odd number and the distributed Bragg semiconductor laser includes a diffraction grating with a Bragg wavelength of $f_0$.

2. A carrier-suppressed optical pulse train generation method for causing a distributed Bragg reflector semiconductor laser which comprises a diffraction grating with a Bragg wavelength of $f_0$ to output an optical pulse train with a repetition frequency of $f_{rep}$, said method comprising the steps of:
    carrying out current injection for providing gain necessary for said distributed Bragg reflector semiconductor laser to oscillate;
    setting an oscillation longitudinal mode of said distributed Bragg reflector semiconductor laser such that said oscillation longitudinal mode becomes $f_0 \pm q(f_{rep}/2)$ (wherein q is an odd number); and
    subjecting said distributed Bragg reflector semiconductor laser to either gain- or loss-modulation at the repetition frequency $f_{rep}$.

3. A carrier-suppressed optical pulse train generation method for causing a distributed Bragg reflector semiconductor laser which comprises a diffraction grating with a Bragg wavelength of $f_0$ to output an optical pulse train with a repetition frequency of $f_{rep}$, said method comprising the steps of:
    carrying out current injection for providing gain necessary for said distributed Bragg reflector semiconductor laser to oscillate;
    attenuating reflected light reflected from a cavity facet of one side close to a distributed Bragg reflector region of said distributed Bragg reflector semiconductor laser so that the reflected light does not reach said distributed Bragg reflector region;
    setting an oscillation longitudinal mode of said distributed Bragg reflector semiconductor laser such that said oscillation longitudinal mode becomes $f_0 \pm q(f_{rep}/2)$ (wherein q is an odd number); and
    subjecting said distributed Bragg reflector semiconductor laser to either gain- or loss-modulation at the repetition frequency $f_{rep}$.

4. A distributed Bragg reflector semiconductor laser, which comprises an optical modulation region that modulates optical intensity, a gain region in which population inversion is achieved, a phase control region with a variable effective index, and a distributed Bragg reflector region that includes a diffraction grating with a Bragg wavelength of $f_0$, and in which said optical modulation region, said gain region, said phase control region, and said distributed Bragg reflector region are arranged linearly and housed in a cavity, wherein said distributed Bragg reflector semiconductor laser outputs an optical pulse train with a repetition frequency of $f_{rep}$;

the cavity has a cavity length that is set such that an oscillation longitudinal mode of said distributed Bragg reflector semiconductor laser becomes $f_0 \pm q(f_{rep}/2)$ (wherein q is an odd number); and said optical modulation region has a transmittance that is modulated at the frequency $f_{rep}$, thereby putting said distributed Bragg reflector semiconductor laser under mode-locked operation, and enabling the output of an optical pulse train, which is carrier suppressed and has a the repetition frequency $f_{rep}$.

5. A distributed Bragg reflector semiconductor laser, which comprises an optical modulation region that modulates optical intensity, a gain region in which population inversion is achieved, a phase control region with a variable effective index, a distributed Bragg reflector region that includes a diffraction grating with a Bragg wavelength of $f_0$, and an optical absorption coefficient adjustment region for adjusting an optical absorption coefficient, and in which said optical modulation region, said gain region, said phase control region, said distributed Bragg reflector region, and said optical absorption coefficient adjustment region are arranged linearly and housed in a cavity, wherein said distributed Bragg reflector semiconductor laser outputs an optical pulse train with a repetition frequency of $f_{rep}$;

said optical absorption coefficient adjustment region has an optical absorption coefficient with a value that is set to a sufficient size that prevents reflected light, which is reflected from a cavity facet of said optical absorption coefficient adjustment region, from reaching said distributed Bragg reflector region;

the cavity of said distributed Bragg reflector semiconductor laser has a length that is set such that an oscillation longitudinal mode of said distributed Bragg reflector semiconductor laser becomes $f_0 \pm q(f_{rep}/2)$ (wherein q is an odd number); and said optical modulation region has a transmittance that is modulated at the repetition frequency $f_{rep}$, thereby putting said distributed Bragg reflector semiconductor laser under mode-locked operation and enabling the output of an optical pulse train which is carrier suppressed and has the repetition frequency $f_{rep}$.

6. The distributed Bragg reflector semiconductor laser according to claim 4, wherein said phase control region and said distributed Bragg reflector region comprise an electrode, which supplies current for modulating effective indices of the regions by respectively generating a plasma effect.

7. The distributed Bragg reflector semiconductor laser according to claim 5, wherein said phase control region and said distributed Bragg reflector region comprise an electrode, which supplies current for modulating effective indices of the regions by respectively generating a plasma effect.

8. The distributed Bragg reflector semiconductor laser according to claim 4, wherein said phase control region and said distributed Bragg reflector region comprise an electrode, which applies voltage for modulating effective indices of the regions by respectively generating a Pockels effect.

9. The distributed Bragg reflector semiconductor laser according to claim 5, wherein said phase control region and said distributed Bragg reflector region comprise an electrode, which applies voltage for modulating effective indices of the regions by respectively generating a Pockels effect.

10. The distributed Bragg reflector semiconductor laser according to claim 4, wherein said phase control region and said distributed Bragg reflector region comprise resistance heating layers for respectively controlling temperatures of the regions.

11. The distributed Bragg reflector semiconductor laser according to claim 5, wherein said phase control region and said distributed Bragg reflector region comprise resistance heating layers for respectively controlling temperatures of the regions.

* * * * *